US011309372B2

(12) United States Patent
Choi et al.

(10) Patent No.: US 11,309,372 B2
(45) Date of Patent: Apr. 19, 2022

(54) ORGANIC LIGHT-EMITTING DIODE DISPLAY WITH REDUCED LATERAL LEAKAGE

(71) Applicant: Apple Inc., Cupertino, CA (US)

(72) Inventors: Jaein Choi, San Jose, CA (US); Andrew Lin, Berkeley, CA (US); Cheuk Chi Lo, Belmont, CA (US); Chun-Yao Huang, San Jose, CA (US); Gloria Wong, Mountain View, CA (US); Hairong Tang, San Jose, CA (US); Hitoshi Yamamoto, Palo Alto, CA (US); James E. Pedder, Oxon (GB); KiBeom Kim, Cupertino, CA (US); Kwang Ohk Cheon, San Jose, CA (US); Lei Yuan, San Jose, CA (US); Michael Slootsky, Santa Clara, CA (US); Rui Liu, San Jose, CA (US); Steven E. Molesa, San Jose, CA (US); Sunggu Kang, San Jose, CA (US); Wendi Chang, Santa Clara, CA (US); Chun-Ming Tang, San Jose, CA (US); Cheng Chen, San Jose, CA (US); Ivan Knez, San Jose, CA (US); Enkhamgalan Dorjgotov, Mountain View, CA (US); Giovanni Carbone, Palo Alto, CA (US); Graham B. Myhre, San Jose, CA (US); Jungmin Lee, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 132 days.

(21) Appl. No.: 16/604,491

(22) PCT Filed: Apr. 27, 2018

(86) PCT No.: PCT/US2018/029772
§ 371 (c)(1),
(2) Date: Oct. 10, 2019

(87) PCT Pub. No.: WO2018/212960
PCT Pub. Date: Nov. 22, 2018

(65) Prior Publication Data
US 2020/0066815 A1    Feb. 27, 2020

Related U.S. Application Data

(60) Provisional application No. 62/507,646, filed on May 17, 2017, provisional application No. 62/635,433, filed on Feb. 26, 2018.

(51) Int. Cl.
*H01L 27/32* (2006.01)
*H01L 27/12* (2006.01)
*H01L 51/56* (2006.01)

(52) U.S. Cl.
CPC ........ *H01L 27/3246* (2013.01); *H01L 27/124* (2013.01); *H01L 27/326* (2013.01);
(Continued)

(58) Field of Classification Search
CPC ............ H01L 27/3246; H01L 27/3283; H01L 27/3248; H01L 27/3253;
(Continued)

(56) References Cited

U.S. PATENT DOCUMENTS 5,910,706 A * 6/1999 Stevens ............... H01L 51/5271
313/498
6,104,367 A * 8/2000 McKnight ............ G09G 3/2011
345/103
(Continued)

FOREIGN PATENT DOCUMENTS

CN          1509127 A     6/2004
CN       101582442 A     11/2009
(Continued)

*Primary Examiner* — Maliheh Malek
(74) *Attorney, Agent, or Firm* — Treyz Law Group, P.C.; Joseph F. Guihan

(57) ABSTRACT

An organic light-emitting diode (OLED) display may have an array of organic light-emitting diode pixels that each have
(Continued)

OLED layers interposed between a cathode and an anode. Voltage may be applied to the anode of each pixel to control the magnitude of emitted light. The conductivity of the OLED layers may allow leakage current to pass between neighboring anodes in the display. To reduce leakage current and the accompanying cross-talk in a display, the pixel definition layer may disrupt continuity of the OLED layers. The pixel definition layer may have a steep sidewall, a sidewall with an undercut, or a sidewall surface with a plurality of curves to disrupt continuity of the OLED layers. A control gate that is coupled to a bias voltage and covered by gate dielectric may be used to form an organic thin-film transistor that shuts the leakage current channel between adjacent anodes on the display.

12 Claims, 24 Drawing Sheets

(52) U.S. Cl.
CPC ...... *H01L 27/3248* (2013.01); *H01L 27/3258* (2013.01); *H01L 27/3276* (2013.01); *H01L 27/3283* (2013.01); *H01L 51/56* (2013.01)

(58) Field of Classification Search
CPC ... H01L 27/3276–3279; H01L 27/3297; H01L 51/5206–5218; H01L 27/3258; H01L 27/124; H01L 27/326; H01L 2227/323; H01L 2251/5338; H05B 33/0896
See application file for complete search history.

(56) References Cited

U.S. PATENT DOCUMENTS

| | | | |
|---|---|---|---|
| 6,450,635 B1* | 9/2002 | Okabe | B41J 2/01 347/106 |
| 6,657,305 B1 | 12/2003 | Cohen et al. | |
| 7,977,126 B2 | 7/2011 | Lee et al. | |
| 8,076,669 B2 | 12/2011 | Kang et al. | |
| 8,916,859 B2 | 12/2014 | Kim et al. | |
| 8,940,553 B2 | 1/2015 | Lee et al. | |
| 9,444,050 B2 | 9/2016 | Madigan | |
| 9,614,191 B2 | 4/2017 | Madigan | |
| 9,685,486 B2* | 6/2017 | Cheon | H01L 27/322 |
| 9,978,818 B2 | 5/2018 | Xiong et al. | |
| 10,381,381 B1* | 8/2019 | Choi | H01L 27/3227 |
| 10,468,388 B2* | 11/2019 | Seo | H01L 25/0753 |
| 10,535,840 B2* | 1/2020 | Chen | H01L 51/5206 |
| 10,658,441 B2* | 5/2020 | Cheon | H01L 51/5271 |
| 10,727,424 B2* | 7/2020 | Tanaka | H01L 27/3276 |
| 11,145,700 B2* | 10/2021 | Choi | H01L 51/5278 |
| 2004/0119419 A1 | 6/2004 | Kai et al. | |
| 2005/0017628 A1* | 1/2005 | Prakash | H01L 51/5203 313/504 |
| 2005/0067946 A1* | 3/2005 | Park | H01L 51/5203 313/503 |
| 2006/0061266 A1 | 3/2006 | Kang et al. | |
| 2006/0238111 A1* | 10/2006 | Shimizu | H01L 51/5234 313/503 |
| 2006/0255720 A1* | 11/2006 | Hirai | H01L 51/0005 313/503 |
| 2006/0270082 A1* | 11/2006 | Moriya | H01L 27/3246 438/29 |
| 2007/0020834 A1* | 1/2007 | Hirai | H01L 51/0005 438/197 |
| 2007/0096643 A1* | 5/2007 | Maglione | H01L 27/3246 313/506 |
| 2007/0120797 A1* | 5/2007 | Lin | G02F 1/133555 345/92 |
| 2007/0264814 A1* | 11/2007 | Hirai | H01L 27/1292 438/617 |
| 2009/0122247 A1* | 5/2009 | Chang | G02F 1/134363 349/110 |
| 2009/0195144 A1* | 8/2009 | Kitabayashi | H01L 27/3246 313/503 |
| 2009/0212303 A1* | 8/2009 | Toerker | H01L 27/3246 257/88 |
| 2009/0322210 A1* | 12/2009 | Yokoo | H01L 27/3283 313/504 |
| 2010/0033089 A1 | 2/2010 | Nakamura et al. | |
| 2010/0062147 A1* | 3/2010 | Kinoshita | G02F 1/133516 427/58 |
| 2010/0181559 A1* | 7/2010 | Nakatani | H01L 27/3283 257/40 |
| 2010/0193817 A1* | 8/2010 | Amamiya | H01L 51/56 257/98 |
| 2010/0295033 A1* | 11/2010 | Rokuhara | H01L 27/3246 257/40 |
| 2011/0241027 A1 | 10/2011 | Kaneta et al. | |
| 2012/0007067 A1 | 1/2012 | Kaneta et al. | |
| 2012/0098805 A1* | 4/2012 | Kubota | G09G 3/3258 345/205 |
| 2012/0228603 A1* | 9/2012 | Nakamura | H01L 51/5234 257/40 |
| 2013/0009154 A1* | 1/2013 | Choi | H01L 27/1255 257/59 |
| 2013/0170008 A1* | 7/2013 | Shin | G02B 26/005 359/228 |
| 2013/0285026 A1* | 10/2013 | Miskiewicz | C08L 65/00 257/40 |
| 2014/0048795 A1 | 2/2014 | Kim et al. | |
| 2014/0091285 A1* | 4/2014 | Shin | H01L 51/5203 257/40 |
| 2014/0175470 A1* | 6/2014 | Yokoyama | H01L 51/5072 257/89 |
| 2015/0001486 A1* | 1/2015 | Kim | H01L 27/3246 257/40 |
| 2015/0048328 A1 | 2/2015 | Kato et al. | |
| 2015/0069361 A1 | 3/2015 | Sato et al. | |
| 2015/0137097 A1* | 5/2015 | Choi | H01L 27/3279 438/23 |
| 2015/0213768 A1* | 7/2015 | Jung | G09G 3/003 345/694 |
| 2015/0236076 A1* | 8/2015 | Sim | H01L 27/326 438/34 |
| 2015/0379938 A1 | 12/2015 | Choi et al. | |
| 2016/0005798 A1* | 1/2016 | Akiyama | H01L 27/3246 257/72 |
| 2016/0012775 A1 | 1/2016 | Jeong et al. | |
| 2016/0104757 A1* | 4/2016 | Kim | H01L 27/1222 438/34 |
| 2016/0118420 A1* | 4/2016 | Yang | H01L 27/1255 257/40 |
| 2016/0133190 A1* | 5/2016 | Kim | G09G 3/2011 345/80 |
| 2016/0248035 A1 | 8/2016 | Hwang et al. | |
| 2016/0268354 A1 | 9/2016 | Xiong et al. | |
| 2016/0349899 A1* | 12/2016 | Hwang | G06F 3/0412 |
| 2017/0010734 A1* | 1/2017 | Liu | H01L 27/323 |
| 2017/0023833 A1* | 1/2017 | No | G02F 1/134309 |
| 2017/0062528 A1* | 3/2017 | Aoyama | H01L 27/3246 |
| 2017/0263688 A1* | 9/2017 | Li | H01L 27/3246 |
| 2017/0317104 A1 | 11/2017 | Jeong et al. | |
| 2017/0338293 A1* | 11/2017 | Guo | H01L 21/77 |
| 2017/0365217 A1* | 12/2017 | An | H01L 27/3279 |
| 2018/0005574 A1* | 1/2018 | Kim | H01L 51/5234 |
| 2018/0047791 A1* | 2/2018 | Tsai | H01L 27/322 |
| 2018/0226459 A1* | 8/2018 | Bae | H01L 27/124 |
| 2018/0331165 A1* | 11/2018 | Li | H01L 51/5203 |
| 2019/0013471 A1* | 1/2019 | Nishida | C23C 14/24 |
| 2019/0067394 A1* | 2/2019 | Cheon | H01L 27/3283 |
| 2019/0088726 A1* | 3/2019 | Zhang | H01L 27/3211 |
| 2019/0237701 A1* | 8/2019 | Chen | H01L 27/124 |
| 2019/0347989 A1* | 11/2019 | Lee | H01L 51/5237 |
| 2019/0363290 A1* | 11/2019 | Watanabe | H01L 51/0097 |
| 2020/0035951 A1* | 1/2020 | Cheon | H01L 51/56 |

(56) References Cited

U.S. PATENT DOCUMENTS

| | | | |
|---|---|---|---|
| 2020/0105179 A1* | 4/2020 | Greenebaum | G09G 3/2051 |
| 2020/0303479 A1* | 9/2020 | Kim | G09G 3/3225 |
| 2020/0312930 A1* | 10/2020 | Choi | H01L 51/5278 |

FOREIGN PATENT DOCUMENTS

| | | |
|---|---|---|
| CN | 101650917 A | 2/2010 |
| CN | 102738200 A | 10/2012 |
| CN | 103137893 A | 6/2013 |
| CN | 104538423 A | 4/2015 |
| CN | 104659070 A | 5/2015 |
| CN | 105280676 A | 1/2016 |
| CN | 105655377 A | 6/2016 |
| EP | 2175504 A1 | 4/2010 |
| EP | 2955766 A1 | 12/2015 |
| JP | 2004192935 A | 7/2004 |
| JP | 2014232631 A | 12/2014 |
| JP | 2015207526 A | 11/2015 |
| KR | 20070063131 A | 6/2007 |
| KR | 20080082656 A | 9/2008 |
| KR | 20120066492 A | 6/2012 |
| KR | 20140052969 A | 5/2014 |
| KR | 20140140484 A | 12/2014 |
| KR | 20160072010 A | 6/2016 |
| KR | 20160089939 A | 7/2016 |
| WO | 2010109877 A1 | 9/2010 |

* cited by examiner

ORGANIC LIGHT-EMITTING DIODE DISPLAY WITH REDUCED LATERAL LEAKAGE

This patent application claims priority to provisional patent application No. 62/507,646, filed on May 17, 2017, and provisional patent application No. 62/635,433, filed Feb. 26, 2018, which are hereby incorporated by reference herein in their entireties.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

To emit light from a given pixel in an organic light-emitting diode display, a voltage may be applied to the anode of the given pixel. Ideally, the voltage at the anode of the given pixel would not affect any neighboring pixels. However, the conductivity of the OLED layers over the anode may allow lateral conduction from the anode of the given pixel to the anodes of adjacent pixels. This may cause pixel cross-talk that allows nominally 'off' pixels to emit light due to an adjacent 'on' pixel's leakage. The pixel cross-talk may degrade display performance and cause a color-shift in the resulting image.

It may be desirable to reduce the distance between pixels in a display in order to increase the resolution of the display. However, pixel cross-talk due to lateral conduction through OLED layers may worsen as the distance between pixels decreases.

It would therefore be desirable to be able to provide improved displays for electronic devices.

SUMMARY

An electronic device may have a display such as an organic light-emitting diode display. The organic light-emitting diode (OLED) display may have an array of organic light-emitting diode pixels that each have OLED layers interposed between a cathode and an anode.

Each organic light-emitting diode pixel may have a respective anode. Voltage may be applied to the anode of each organic light-emitting diode pixel to control how much light is emitted from each organic light-emitting diode pixel. OLED layers formed above the anode such as a hole injection layer and a hole transport layer may be conductive. The conductivity of the OLED layers may allow leakage current to pass between neighboring anodes in the display.

To reduce leakage current and the accompanying cross-talk in a display, a structure may be positioned between neighboring anodes in the display. For example, a conductive contact that is coupled to a bias voltage may be interposed between adjacent anodes in the display. Alternatively, a T-shaped or tapered structure may be interposed between adjacent anodes in the display. When the OLED layers are deposited, the T-shaped or tapered structure may break the continuity of the OLED layers and prevent leakage current from passing between adjacent anodes. Another way to break the continuity of the OLED layers is to form a trench in the underlying substrate before depositing the OLED layers.

A pixel definition layer interposed between adjacent anodes in the display may be used to break the continuity of the OLED layers and prevent leakage current from passing between the adjacent anodes. The pixel definition layer may have a steep sidewall to break the continuity of the OLED layers. The pixel definition layer may have a sidewall with an undercut to break the continuity of the OLED layers. The pixel definition layer may be formed from multiple layers of material to allow etching of a desired sidewall surface. The pixel definition layer may have a sidewall surface with a plurality of curves to break the continuity of the OLED layers.

An energy source may be used to expose the OLED layers to energy to damage the OLED layers and reduce the conductivity of the exposed portions of the OLED layers. A fluorinated self-aligned monolayer may be formed beneath the OLED layers to selectively disorder the OLED layers and cause reduced conductivity in the affected portions.

Each organic light-emitting diode pixel may include a leakage current control transistor that is coupled to a bias voltage. When an emission transistor of the organic light-emitting diode pixel is asserted, the leakage current control transistor may be asserted to prevent cross-talk within the display.

A control gate that is coupled to a bias voltage and covered by gate dielectric may be used to form an organic thin-film transistor that shuts a leakage current channel between adjacent anodes on the display. The control gate may be overlapped by a pixel definition layer or may be embedded within the pixel definition layer.

The display may include a reflective layer formed beneath patterned anodes to increase the efficiency of the display. To reduce lateral leakage while maintaining the improved efficiency, the size of the patterned anodes may be reduced.

DETAILED DESCRIPTION

Figure 1:
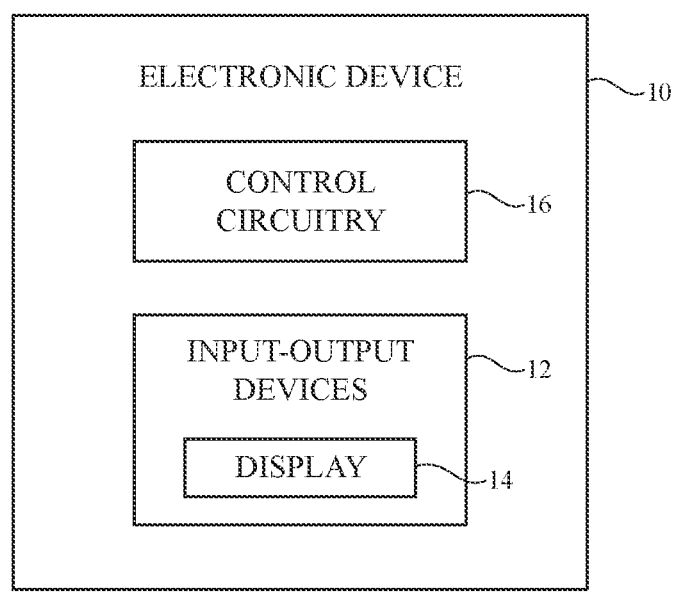
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
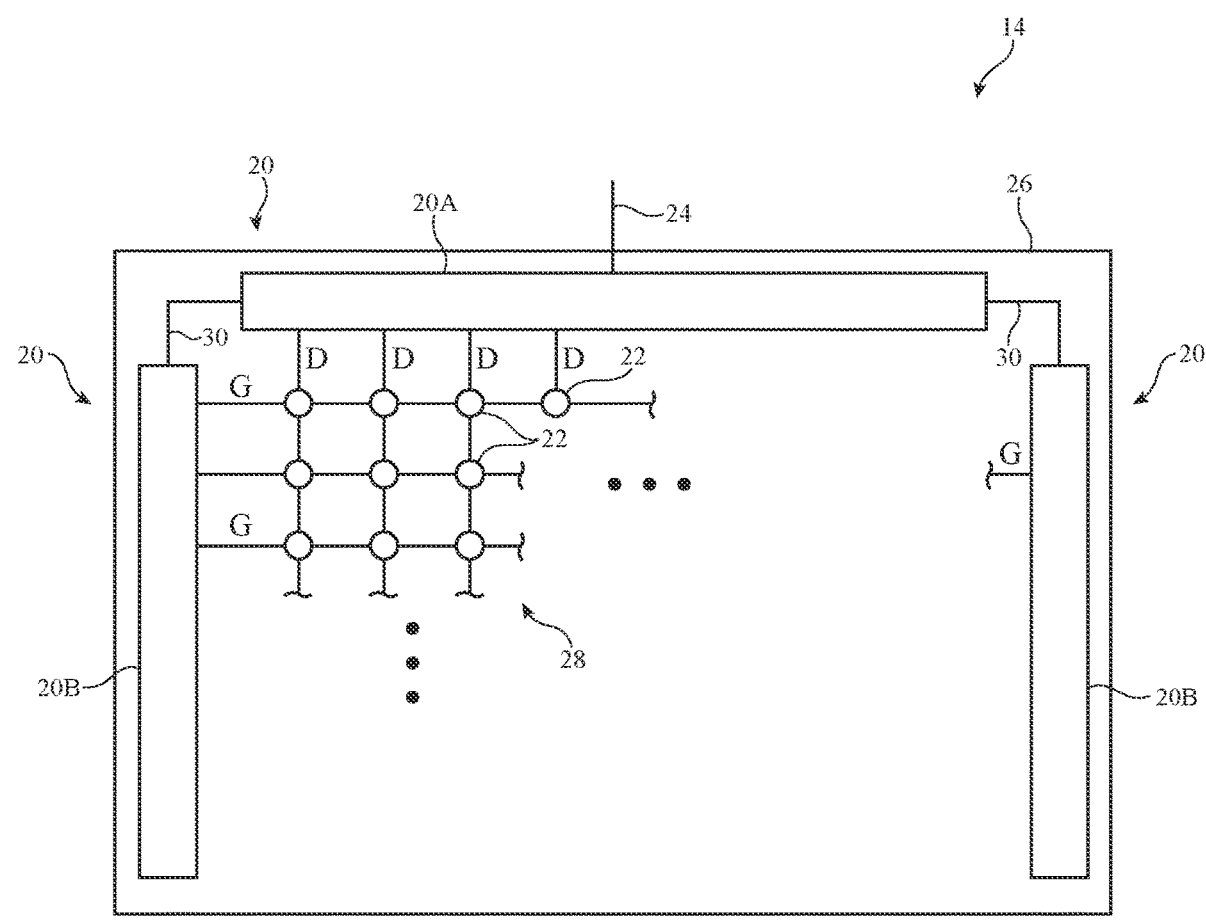
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
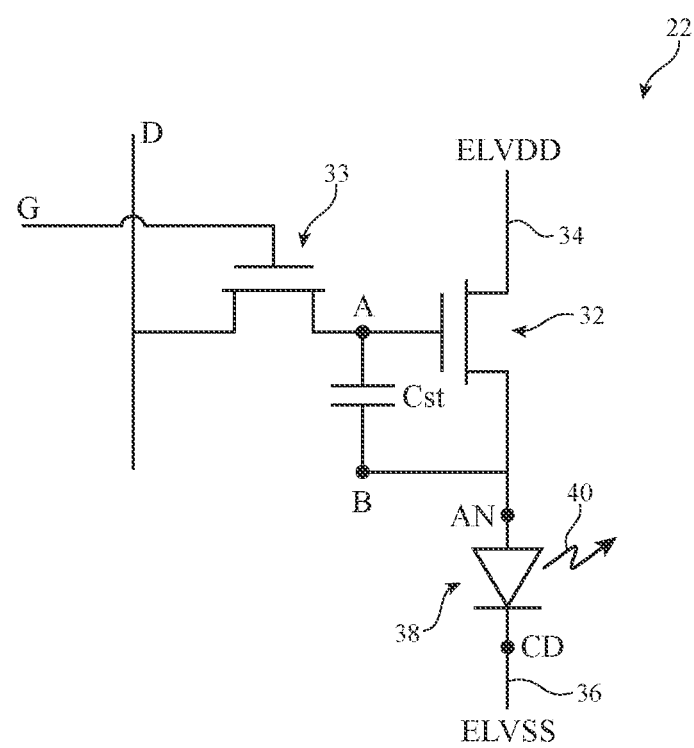
FIG. 3 is a diagram of an illustrative pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel circuit of FIG. 3 is merely illustrative.

Figure 4:
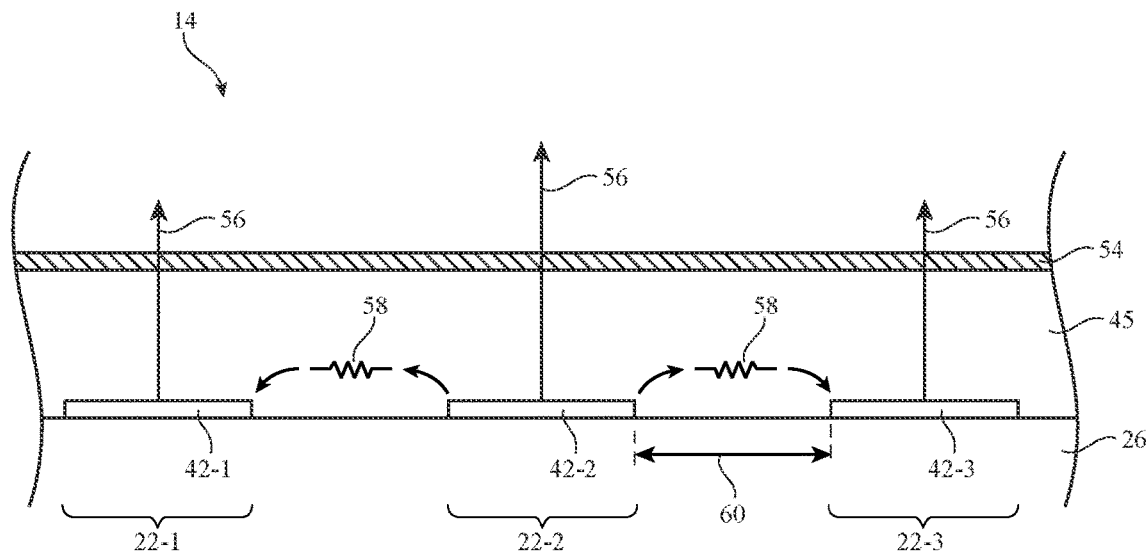
FIG. 4 is a cross-sectional side view of an illustrative organic light-emitting diode display showing lateral current leakage between adjacent anodes in accordance with an embodiment.

FIG. 4 is a cross-sectional side view of an illustrative display with organic light-emitting diode display pixels. As shown, display 14 may include a substrate 26. Substrate 26 may be formed from glass, plastic, polymer, silicon, or any other desired material. Anodes such as anodes 42-1, 42-2, and 42-3 may be formed on the substrate. Anodes 42-1, 42-2, and 42-3 may be formed from conductive material and may be covered by OLED layers 45 and cathode 54. OLED layers 45 may include one or more layers for forming an organic light-emitting diode. For example, layers 45 may include one or more of a hole-injection layer (HIL), a hole-transport layer (HTL), an emissive layer (EML), an electron-transport layer (ETL), and an electronic-injection layer (EIL). Cathode 54 may be a conductive layer formed on the OLED layers 45. Cathode layer 54 may form a common cathode terminal (see, e.g., cathode terminal CD of FIG. 3) for all diodes in display 14. Cathode layer 54 may be formed from a transparent conductive material (e.g., indium tin oxide, a metal layer(s) that is sufficiently thin to be transparent, a combination of a thin metal and indium tin oxide, etc.). Each anode in display 14 may be independently controlled, so that each diode in display 14 can be independently controlled. This allows each pixel 22 to produce an independently controlled amount of light.

Anodes 42-1, 42-2, and 42-3 may each be associated with a respective pixel. For example, anode 42-1 may be associated with pixel 22-1, anode 42-2 may be associated with pixel 22-2, and anode 42-3 may be associated with pixel 22-3. To emit light from a pixel, a voltage may be applied to the anode of the respective pixel. Take an example in which it is desired to emit light from pixel 22-2 (without emitting light from pixels 22-1 and 22-3). A voltage may be applied to anode 42-2, which causes light 56 to be emitted from pixel 22-2. As previously stated, it would be desirable if no light was emitted from pixels 22-1 and 22-3 as a result of voltage being applied to anode 42-2. However, as shown, leakage may occur through OLED layers 45 between anode 42-2 and anode 42-1, as well as between anode 42-2 and anode 42-3. There may be a resistance 58 (i.e., a resistance associated with the OLED layers) between anode 42-2 and the adjacent anodes that helps prevent leakage. The greater the resistance, the less leakage current will reach anodes 42-1 and 42-3. However, the resistance may not be large enough to totally eliminate leakage between anode 42-2 and anodes 42-1 and 42-3. As shown, even though pixels 22-1 and 22-3 are intended to be off, light 56 may be emitted from pixels 22-1 and 22-3. The resistance 58 between adjacent anodes may be reduced as the distance 60 between adjacent anodes is reduced. In order to maximize display resolution, it is desirable for the distance 60 between adjacent anodes to be small. However, this reduces the resistance 58 between anodes and increases cross-talk between pixels.

Although not shown in FIG. 4, display 14 may optionally include a pixel definition layer (PDL). The pixel definition layer may be formed from a dielectric material and may be interposed between adjacent anodes of the display. The pixel definition layer may have openings in which the anodes are formed, thereby defining the area of each pixel. Each of the following embodiments of an organic light-emitting diode display may optionally include a pixel definition layer.

Figure 5:
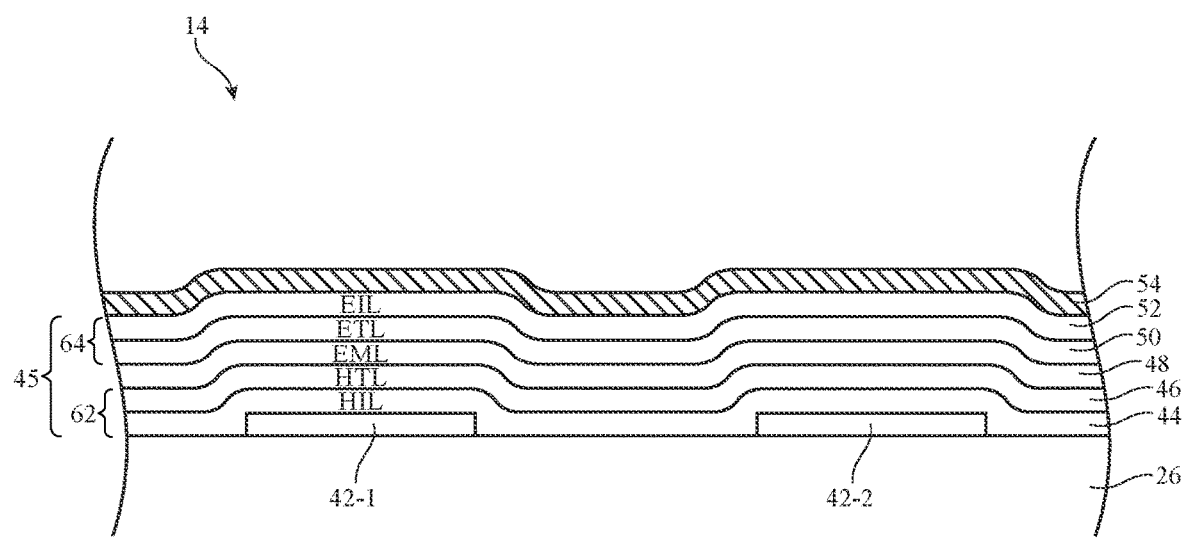
FIG. 5 is a cross-sectional side view of an illustrative organic light-emitting diode display showing different layers of the organic light-emitting diodes in accordance with an embodiment.

FIG. 5 is a cross-sectional side view of an illustrative display with organic light-emitting diode display pixels. FIG. 5 shows details of the OLED layers 45 from FIG. 4. As shown, OLED layers 45 (sometimes referred to as an organic stack-up, an organic stack, or an organic light-emitting diode (OLED) stack) may include a hole injection layer (HIL) 44, a hole transport layer (HTL) 46, an emissive layer (EML) 48, an electron transport layer (ETL) 50, and an electronic injection layer (EIL) 52 interposed between anodes 42 and cathode 54. The hole injection layer and hole transport layer may collectively be referred to as a hole layer (i.e., hole layer 62). The electron transport layer and the electron injection layer may collectively be referred to as an electron layer (i.e., electron layer 64). Emissive layer 48 may include organic electroluminescent material. As shown, hole layer 62 and electron layer 64 may be blanket (common) layers that cover the entire array.

Ideally, adjacent diodes in display 14 operate independently. In practice, the presence of common layers such as hole layer 62 present an opportunity for leakage current from one diode to flow laterally into an adjacent diode, thereby potentially disrupting the adjacent diode. For example, there is a possibility that the process of applying a drive current between anode 42-1 and cathode 54 will give rise to lateral leakage current through hole layer 62 (e.g., a current from anode 42-1 to anode 42-2). In order to reduce leakage between anodes through hole layer 62, it may be desirable to form the hole layer as a patterned layer that is discontinuous between adjacent anodes.

The examples of layers included between the anodes 42 and the cathode 54 in FIG. 5 are merely illustrative. If desired, additional layers may be included between anodes 42 and cathode 54 (i.e., an electron blocking layer, a charge generation layer, a hole blocking layer, etc.). In general, any desired layers may be included in between the anodes and the cathode and any layer that is formed across the display may be considered a common laterally conductive layer. Each layer in OLED layers 45 may be formed from any desired material. In some embodiments, the layers may be formed from organic material. However, in some cases one or more layers may be formed from inorganic material or a material doped with organic or inorganic dopants.

In the example of FIG. 5, a patterned anode layer is formed below a common cathode layer. This example is merely illustrative. If desired, the organic light-emitting diode may be inverted such that the cathode is patterned per-pixel and the anode is a common layer. In this case, the order of the OLED layers in organic stack 45 may be inverted as well. For example, the electron injection layer may be formed on a patterned cathode, the electron transport layer may be formed on the electron injection layer, the emissive layer may be formed on the electron transport layer, the hole transport layer may be formed on the emissive layer, the hole injection layer may be formed on the hole transport layer, and a common anode layer may be formed on the hole injection layer.

In subsequent embodiments, a patterned anode is depicted as being positioned below a common cathode layer. However, it should be understood that in each of these embodiments the anode and cathode may be inverted as previously described.

Figure 6:
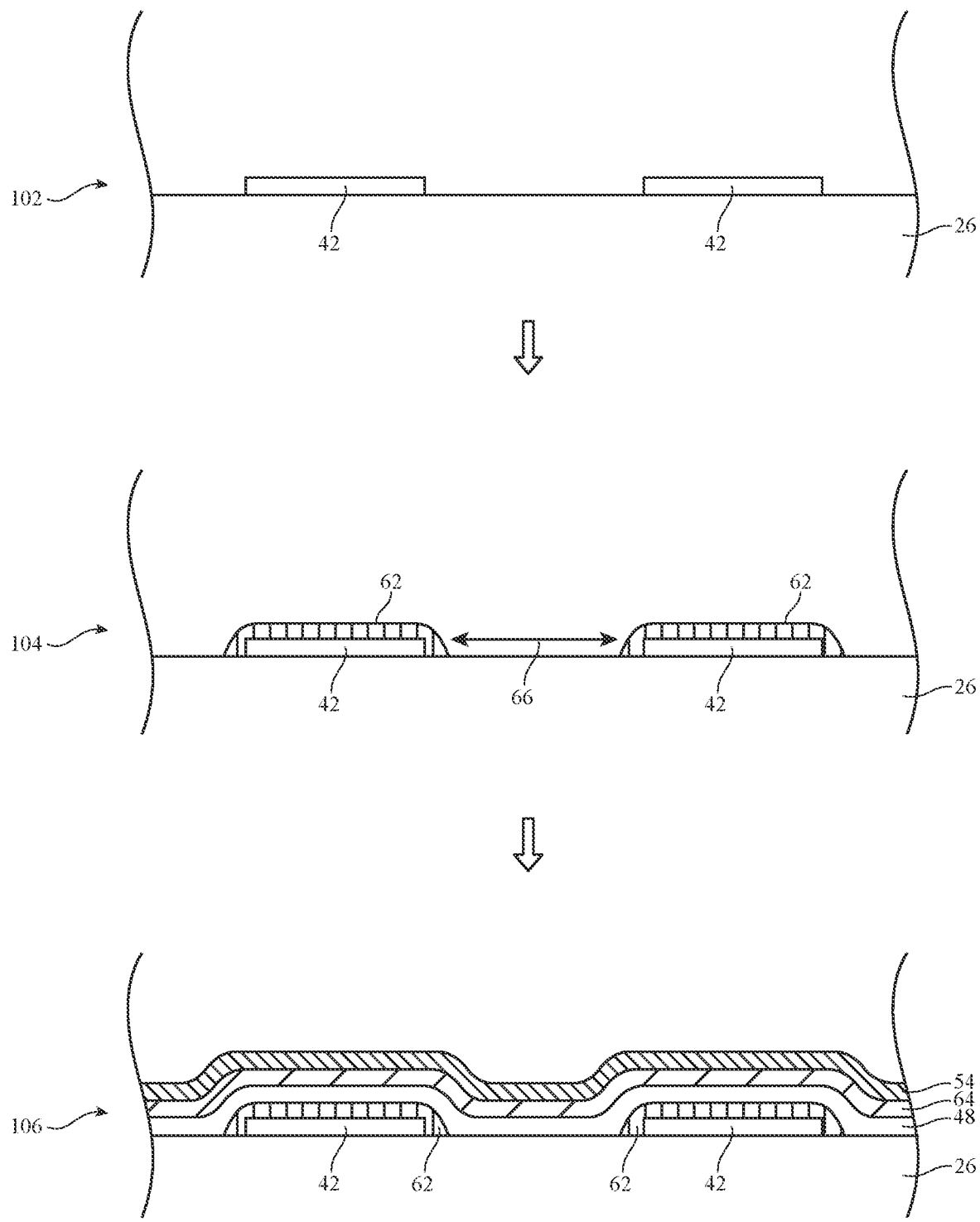
FIG. 6 shows an illustrative method of forming a patterned hole layer for an organic light-emitting diode display in accordance with an embodiment.

FIG. 6 shows cross-sectional side views of a display after various steps in an illustrative method of forming an organic light-emitting diode display with a patterned hole layer. As shown, at step 102, anodes 42 (sometimes referred to as patterned electrodes) may be provided on a substrate 26. Next, at step 104, hole layer 62 may be deposited. Instead of being deposited as a blanket layer (as in FIG. 5), hole layer 62 in FIG. 6 may be deposited so that only anodes 42 are covered by the hole layer and there is a gap 66 between portions of the hole layer. Although depicted in FIG. 6 as a single layer, it can be understood that hole layer 62 may include a hole injection layer and a hole transport layer (as shown in FIG. 5, for example). Forming hole layer 62 as a discontinuous layer may prevent leakage current from passing between adjacent anodes.

Finally, at step 106, additional layers of the organic light-emitting diode display may be formed over the hole layer. The additional layers may be formed as blanket layers that cover the entire array of display pixels in a continuous fashion. Emissive layer 48, electron layer 64, and cathode 54 (sometimes referred to as a common electrode) may all be formed over hole layer 62 as blanket layers.

As previously described, in some cases patterned electrode 42 may be a patterned cathode layer instead of a patterned anode layer. In these embodiments, electron layer 64 may be selectively deposited on the patterned electrode 42. Electron layer 64 and hole layer 62 may both be considered common laterally conductive layers. Therefore, FIG. 6 shows a common laterally conductive layer selectively deposited on patterned electrodes 42. A common electrode is formed over the laterally conductive layer and the patterned electrodes.

Figure 7:
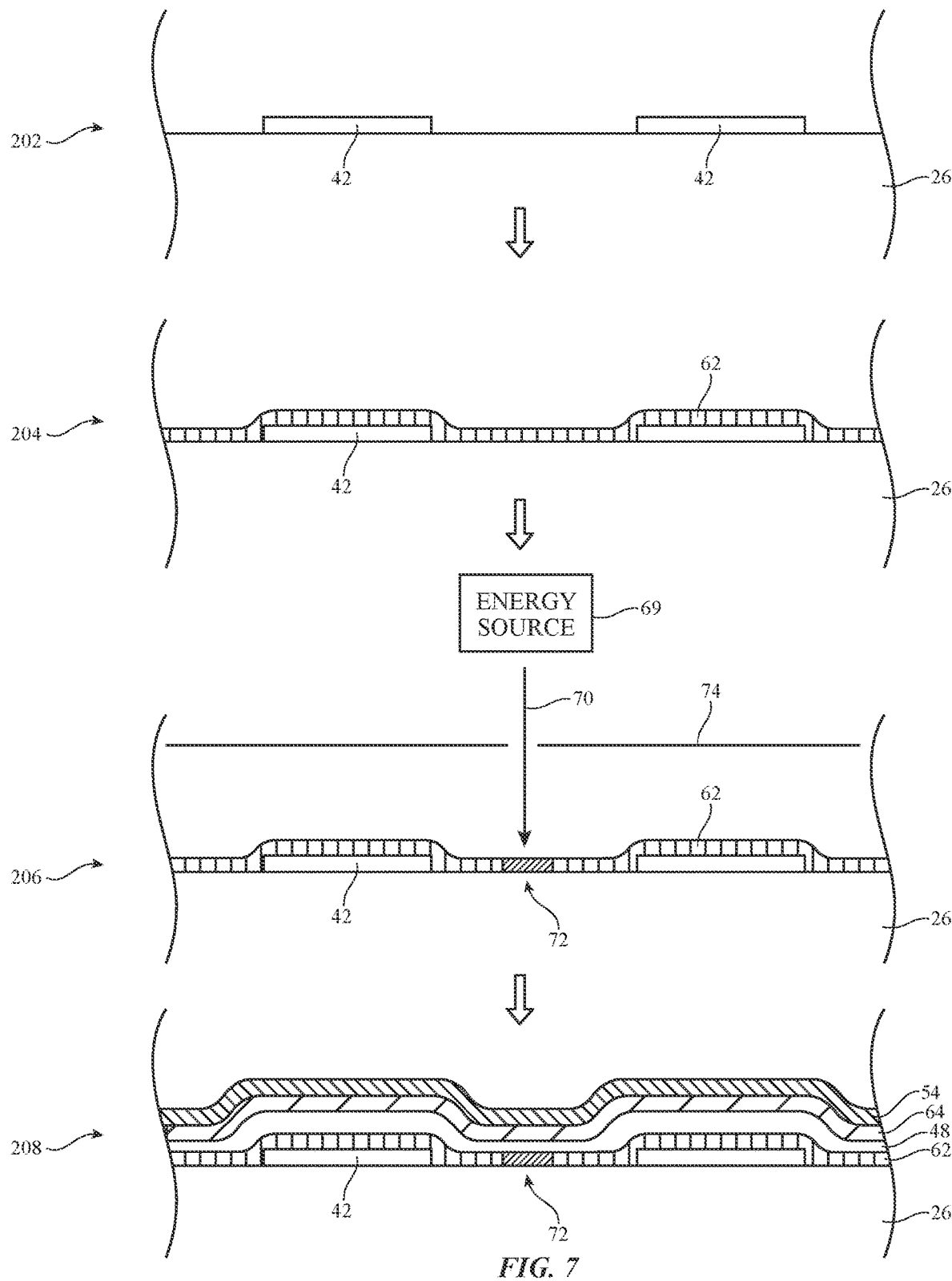
FIG. 7 shows an illustrative method of selectively exposing portions of a hole layer to energy through a masking layer to reduce conductivity and reduce lateral current leakage in accordance with an embodiment.

FIG. 7 shows an illustrative method of forming an organic light-emitting diode display with a selectively altered hole layer. As shown, at step 202 anodes 42 may be formed on substrate 26. Next, at step 204 hole layer 62 may be formed as a blanket layer across the entire display. As previously discussed, the conductivity of hole layer 62 may result in lateral leakage between adjacent anodes. To prevent this lateral leakage, the hole layer may be selectively altered to have a region of reduced conductivity between anodes. This reduced conductivity region may increase the resistance between adjacent anodes and reduce the prevalence of cross-talk between pixels.

At step 206, energy 70 may be emitted towards region 72 of the hole layer between adjacent anodes. Energy 70 may be emitted from energy source 69 (sometimes referred to as a light source). The energy 70 may induce local damage to hole layer 62 in region 72, reducing the conductivity of the hole layer relative to the remaining portions of the hole layer. Energy source 69 may be an ultraviolet light source, a laser light source, an electron beam, a focused-ion beam (FIB), a gas-cluster ion beam, or any other desired type of energy source. FIG. 7 shows an embodiment where energy 70 is emitted towards hole layer 62 through mask 74. Mask 74 may ensure that only region 72 is exposed to energy 70. For example, in embodiments where an ultraviolet light source is used, mask 74 may ensure only region 72 is exposed to ultraviolet light 70. Mask 74 may be opaque to the energy 70 to prevent energy 70 from passing through the mask and may have an opening that overlaps region 72 and allows energy to reach region 72. In region 72 of hole layer 62, the exposure to the energy may induce either a chemical change or a morphological change that reduces conductivity.

In some embodiments, the energy 70 may be powerful enough to physically remove portions of the hole layer 62.

Finally, at step 208, the emissive layer 48, the electron layer 64, and the cathode 54 may be formed. The emissive layer, electron layer, and cathode may also be formed as blanket layers. After the additional layers are formed, the reduced conductivity of region 72 of hole layer 62 will reduce lateral leakage between adjacent anodes.

FIG. 7 depicts all of region 72 as being damaged to form the reduced conductivity region (i.e., the entire depth of hole layer 62 is damage in region 72 in FIG. 7). However, this example is merely illustrative. The reduced conductivity region may extend through some or all of the hole layer. Additionally, hole layer 62 may include a hole injection layer and a hole transport layer. Some or all of both the hole injection layer and the hole transport layer may include the reduced conductivity region. Additionally, the example of the energy exposure occurring immediately after depositing the hole layer (and before depositing additional layers) is merely illustrative. If desired, the energy exposure may occur after depositing the emissive layer, after depositing the electron layer, or after depositing the cathode. Multiple energy exposure steps may be performed if desired.

Figure 8:
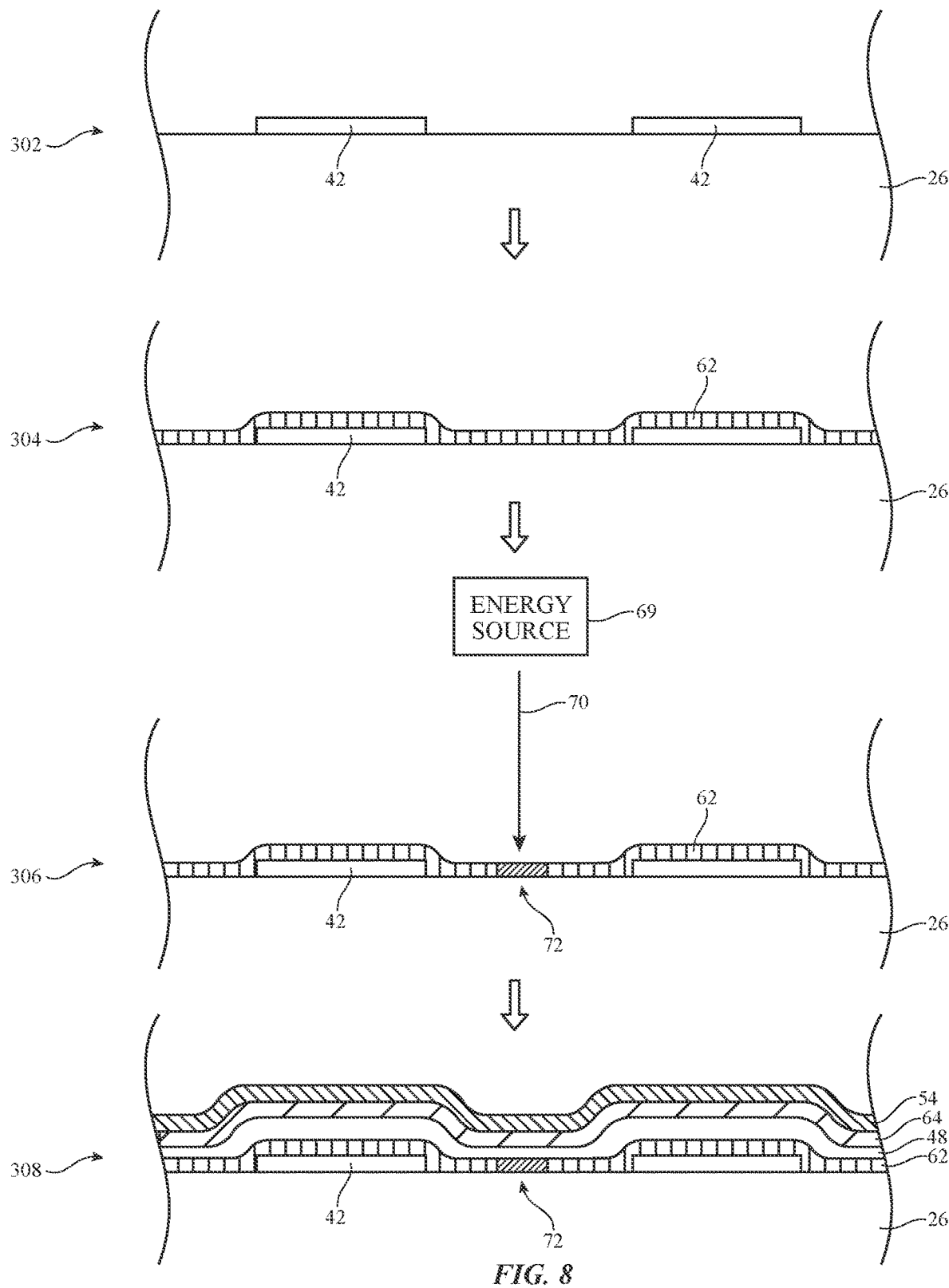
FIG. 8 shows an illustrative method of selectively exposing portions of a hole layer to energy without a masking layer to reduce conductivity and reduce lateral current leakage in accordance with an embodiment.

Mask 74 may also be omitted from the process of FIG. 7, as shown in FIG. 8. FIG. 8 shows an illustrative method of forming an organic light-emitting diode display with a selectively altered hole layer without using mask. As shown, at step 302 anodes 42 may be formed on substrate 26. Next, at step 304 hole layer 62 may be formed as a blanket layer across the entire display. At step 306, energy source 69 may directly apply energy 70 to region 72 of hole layer 62 without an intervening mask layer. Aside from the absence of the masking layer, steps 302, 304, 306, and 308 in FIG. 8 may be the same as steps 202, 204, 206, and 208 in FIG. 7. The masking layer may be omitted in embodiments where energy source 69 is a laser light source, as an example.

In FIGS. 7 and 8, hole layer 62 is depicted as being exposed to energy to selectively reduce conductivity of the layer. However, it should be understood that any layer in the display may be exposed to energy to selectively reduce conductivity.

Figure 9:
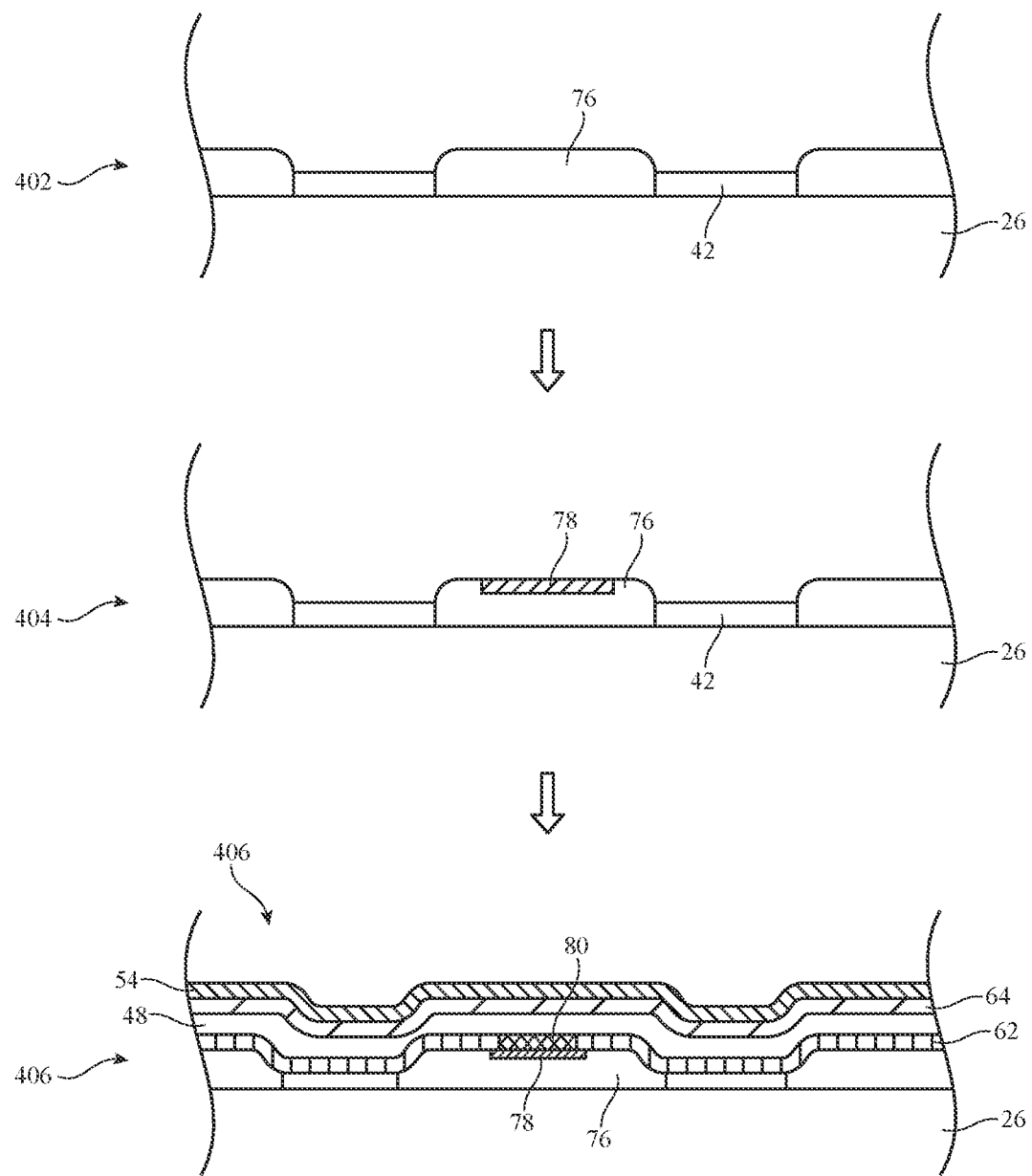
FIG. 9 shows an illustrative method of using fluorinated self-aligned monolayers to selectively disorder portions of a hole layer to reduce conductivity and reduce lateral current leakage in accordance with an embodiment.

FIG. 9 shows yet another illustrative method of forming an organic light-emitting diode display with a reduced-conductivity region in a hole layer of the display. At step 402, anodes 42 may be formed between pixel definition layers (PDL) 76. As previously described in connection with FIG. 4, pixel definition layers 76 may optionally be formed on substrate 26 between the anodes of the display. At step 404 in FIG. 9, a fluorinated self-aligned monolayer (SAM) 78 may be formed on each pixel definition layer. The fluorinated SAM may include a fluorocarbon unit bonded to a hydrocarbon unit. After forming the fluorinated SAM on each pixel definition layer, the layers of the OLED stack may be formed at step 406. Hole layer 62 may be formed over the anodes and pixel definition layers (including the incorporated fluorinated self-aligned monolayers). Emissive layer 48, electron layer 64, and cathode 54 may be formed over the hole layer. The fluorinated SAM 78 may disrupt molecular stacking of overlying hole layer 62 by disrupting $\pi$-$\pi$* stacking. This disordered region of the hole layer (i.e., region 80) may have decreased conductivity relative to the unaffected portions of the hole layer. The decreased conductivity region 80 may help reduce lateral leakage between adjacent anodes.

Figure 10:
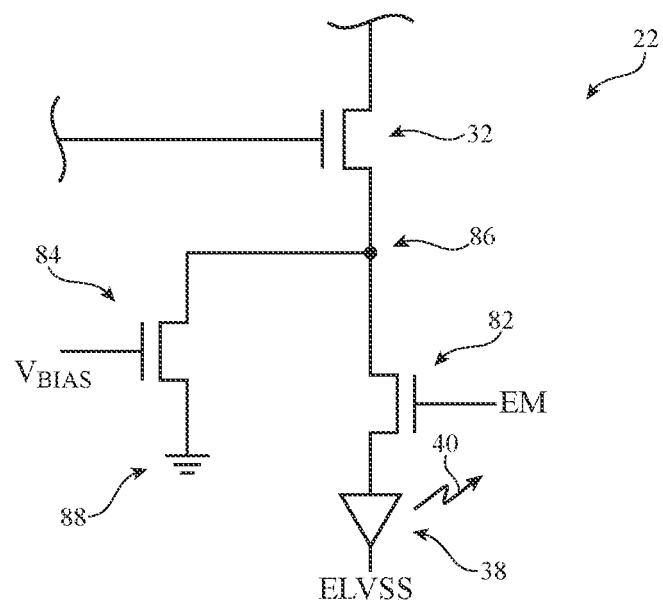
FIG. 10 is a diagram of an illustrative pixel circuit with a leakage current control transistor in accordance with an embodiment.

FIG. 10 shows a portion of an illustrative organic light-emitting diode pixel 22 that may be provided with a leakage current sink to prevent cross-talk between pixels. As shown, the pixel may include a drive transistor 32 and a light-emitting diode 38 (as described in connection with FIG. 3). The pixel may include an emission transistor 82. Emission transistor 82 may be coupled in series with drive transistor 32. Emission transistors such as transistor 82 may sometimes be referred to as emission enable transistors because light emission is enabled when the emission transistors are turned on. In the configuration of FIG. 10, for example, drive transistor 32 can be adjusted to produce a desired amount of drive current through light-emitting diode 38 and thereby emit a desired amount of light 40 only when emission transistor 82 has been turned on. When emission transistor 82 is off, other pixel control circuit operations can be performed (e.g., data loading, threshold voltage compensation to eliminate the dependence of the light-emitting drive current on the threshold voltage of drive transistor 32, etc.). Emission transistor 82 may be controlled by an emission control signal (EM).

As shown in FIG. 10, pixel 22 may include a transistor 84 (sometimes referred to as a leakage current control transistor) that is used to reduce lateral leakage within the display. As previously discussed, in organic light-emitting diode displays leakage current may pass to neighboring pixels and cause unintended emission of light. This unintended emission of light is caused when the leakage current passes through the light-emitting diode of a neighboring pixel. In order to prevent the leakage current from passing through the light-emitting diodes of neighboring pixels, the pixels may include a low impedance path to sink the leakage current. Transistor 84 may be coupled between node 86 and a ground terminal 88. Ground terminal 88 may be analog ground (i.e., 0 Volts), whereas the ground power supply voltage (i.e., ELVSS) for the light-emitting diode may be a negative voltage. Node 86 may be interposed between emission transistor 82 and drive transistor 32. The gate of transistor 84 may be receive a bias voltage ($V_{BIAS}$). When the bias voltage is controlled to turn transistor 84 on, a low impedance path may be provided for the leakage current. By directing the leakage current to ground through transistor 84, the leakage current does not reach the light-emitting diode and cannot cause the light-emitting diode to accidentally emit light. So as to not obfuscate the role of the leakage current control transistor, additional details of the organic light-emitting diode pixel 22 have been omitted from FIG. 10. However, it can be understood that pixel 22 may include additional circuitry (i.e., switching transistors to implement data loading and/or threshold voltage compensation, additional emission transistors, a capacitor for storing data, etc.).

In some embodiments, $V_{BIAS}$ may be a global bias voltage. In other words, every pixel in the entire display may receive the same voltage value for $V_{BIAS}$. However, this may cause unnecessary power consumption. When the emission transistor 82 is off, light-emitting diode 38 is prevented from emitting light (regardless of the leakage current being present). Therefore, the power consumed by controlling the leakage path while emission transistor 82 is off is unnecessary.

Figure 11:
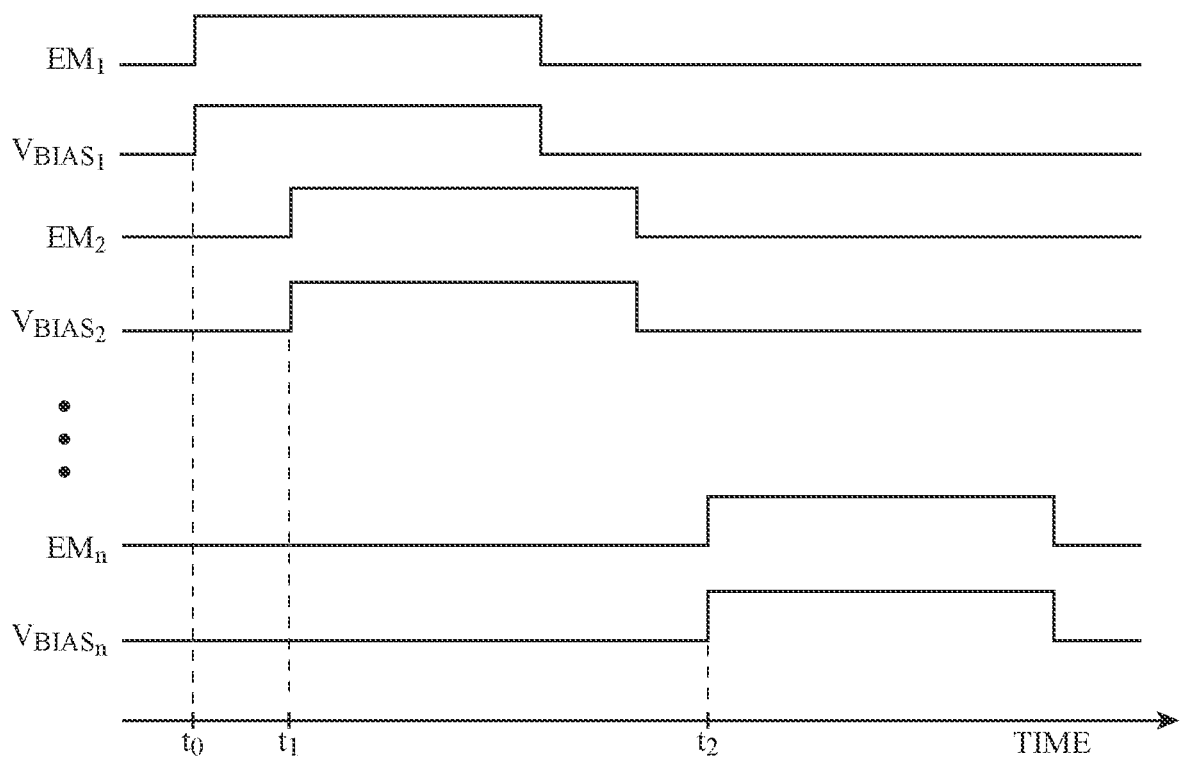
FIG. 11 is a timing diagram showing operation of an illustrative pixel circuit with a leakage current control transistor such as the pixel of FIG. 10 in accordance with an embodiment.

To reduce the power consumption in the display while still reducing pixel cross-talk due to lateral leakage, the bias voltage ($V_{BIAS}$) may be controlled on a row-by-row basis in synchronization with the emission control signal (EM). As shown in FIG. 11, the emission control signal associated with a first row of the display ($EM_1$) may be asserted at $t_0$ to enable emission of light. Also at $t_0$, the bias voltage associated with the first row ($V_{BIAS,1}$) may be raised to provide a leakage current sink in the pixel. Similarly, the emission control signal associated with a second row of the display ($EM_2$) may be asserted at $t_1$ to enable emission of light. Also at $t_1$, the bias voltage associated with the second row ($V_{BIAS,2}$) may be raised to provide a leakage current sink in the pixel. This timing may be continued for each row of the display. The emission control signal associated with the last row of the display ($EM_n$) may be asserted at $t_2$ to enable emission of light. Also at $t_2$, the bias voltage associated with the last row ($V_{BIAS,n}$) may be raised to provide a leakage current sink in the pixel. The bias voltage for each row may be lowered when the emission control signal for that row is deasserted. In other words, the current leakage control transistor is asserted and deasserted in synchronization with the emission transistor being asserted and deasserted. The leakage current transistor may always be asserted while the emission transistor is asserted, and the leakage current transistor may always be deasserted while the emission transistor is deasserted.

Figure 12:
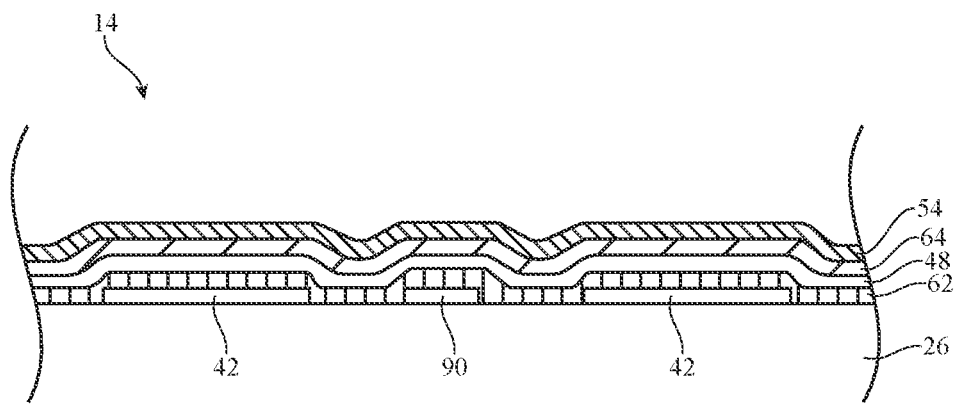
FIG. 12 is a cross-sectional side view of an illustrative organic light-emitting diode display with a conductive contact coupled to a bias voltage that is interposed between adjacent anodes in the display in accordance with an embodiment.

FIG. 12 shows yet another embodiment of an organic light-emitting diode display with reduced lateral leakage. As shown in FIG. 12, anodes 42 may be formed on substrate 26. Hole layer 62 (which may include a hole injection layer and a hole transfer layer) may be formed over the anodes, emissive layer 48 may be formed over the hole layer, and electron layer 64 (which may include an electron injection layer an electron transfer layer) may be formed over the emissive layer. A cathode 54, which may be formed from a transparent conductive material, may be positioned over the electron layer.

The organic light-emitting diode display of FIG. 12 may include an additional conductive layer 90. Conductive layer 90 (sometimes referred to as a conductive contact) may be coupled to a bias voltage. Biasing the conductive layer with an appropriate voltage can cause the conductive layer to act a sink for leakage currents that may otherwise pass between adjacent anodes. Conductive contacts 90 may be formed between each row and each column of the display (i.e., with openings for each anode of the display). Alternatively, the conductive contacts may be formed only between columns of the display or only between rows of the display. In some embodiments, horizontal cross-talk between pixels has a greater risk of disrupting the display. In these embodiments, conductive contacts coupled to a bias voltage may be formed between adjacent columns of the display. These examples are merely illustrative, and conductive layers may be formed in any desired location to reduce lateral leakage between anodes.

Conductive layer 90 may be formed from the same material as anodes 42. Anodes 42 may already be optimized to contact hole layer 62. Accordingly, forming conductive layer 90 from the same material as the anodes ensures that conductive layer 90 and hole layer 62 will be compatible. Anodes 42 and conductive contacts 90 may also be formed in the same processing step if desired. The example of conductive contacts 90 being formed from the same material as anodes 42 is merely illustrative. Conductive contacts 90 may be formed from a different material than anodes 42 if desired. Conductive contacts 90 may be coupled to any desired bias voltage. In some cases, the value of the bias voltage may have a trade-off between power consumption and efficacy of leakage reduction. The value of the bias voltage may be optimized based on these two factors and depending on the specific application of the display.

Figure 13:
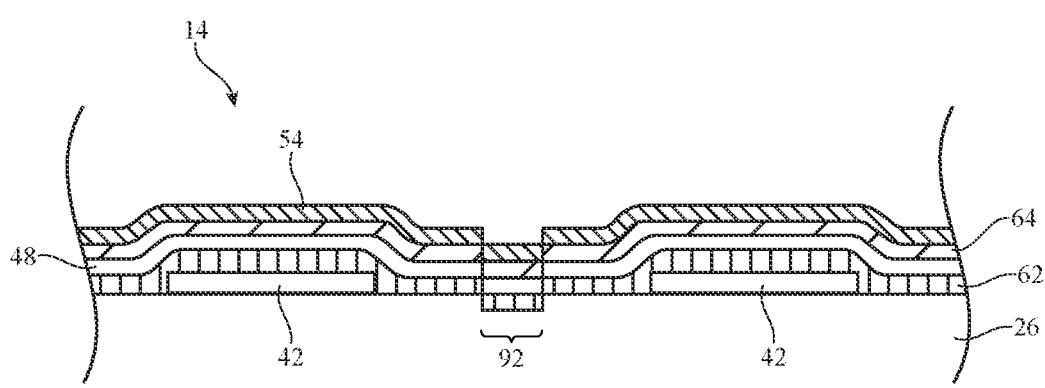
FIG. 13 is a cross-sectional side view of an illustrative organic light-emitting diode display with a trench formed in the substrate to disrupt continuity of the OLED layers in accordance with an embodiment.

FIG. 13 is a cross-sectional side view of an illustrative organic light-emitting diode display with a trench to reduce conductivity and lateral leakage between adjacent anodes. Anodes 42 may be formed on a substrate such as substrate 26. Trench 92 may be formed in substrate 26. When the OLED layers such as hole layer 62, emissive layer 48, electron layer 64, and cathode 54 are deposited across the array, the trench may cause each layer to be lower in the regions in and over the trench. For example, hole layer 62 may have a first portion formed in the trench and a second portion that is not formed in the trench that is formed in a higher plane than the first portion. Emissive layer 48 may have a first portion formed above the trench and a second portion that is not formed above the trench that is formed in a higher plane than the first portion. Electron layer 64 may have a first portion formed above the trench and a second portion that is not formed above the trench that is formed in a higher plane than the first portion. Cathode 54 may have a first portion formed above the trench and a second portion that is not formed above the trench that is formed in a higher plane than the first portion. As shown, hole layer 62 may have a portion formed in trench 92. The portion of hole layer 62 in trench 92 may be surrounded by substrate 26. Emissive layer 48 may have a portion above trench 92 that is interposed between portions of hole layer 62. Electron layer 64 may have a portion above trench 92 that is interposed between portions of emissive layer 48. Cathode 54 may have a portion above trench 92 that is interposed between portions of electron layer 64.

By forming trench 92 in the substrate before depositing the OLED layers, the continuity of the OLED layers may be broken, reducing conductivity and suppressing current leakage between adjacent anodes. Hole layer 62 may be the most susceptible to conducting leakage current. By breaking the continuity of hole layer with the trench, the leakage may be reduced.

If desired, the depth of trench 92 and the thickness of cathode layer 54 may be selected to allow cathode 54 to remain a continuous layer. If the depth of the trench is sufficiently reduced, the portion of the cathode over the trench will contact the portion of the cathode that does not overlap the trench. This will maintain the continuity of the cathode across the array. Increasing the thickness of the cathode may also help ensure a continuous cathode layer despite the underlying trench.

Figure 14:
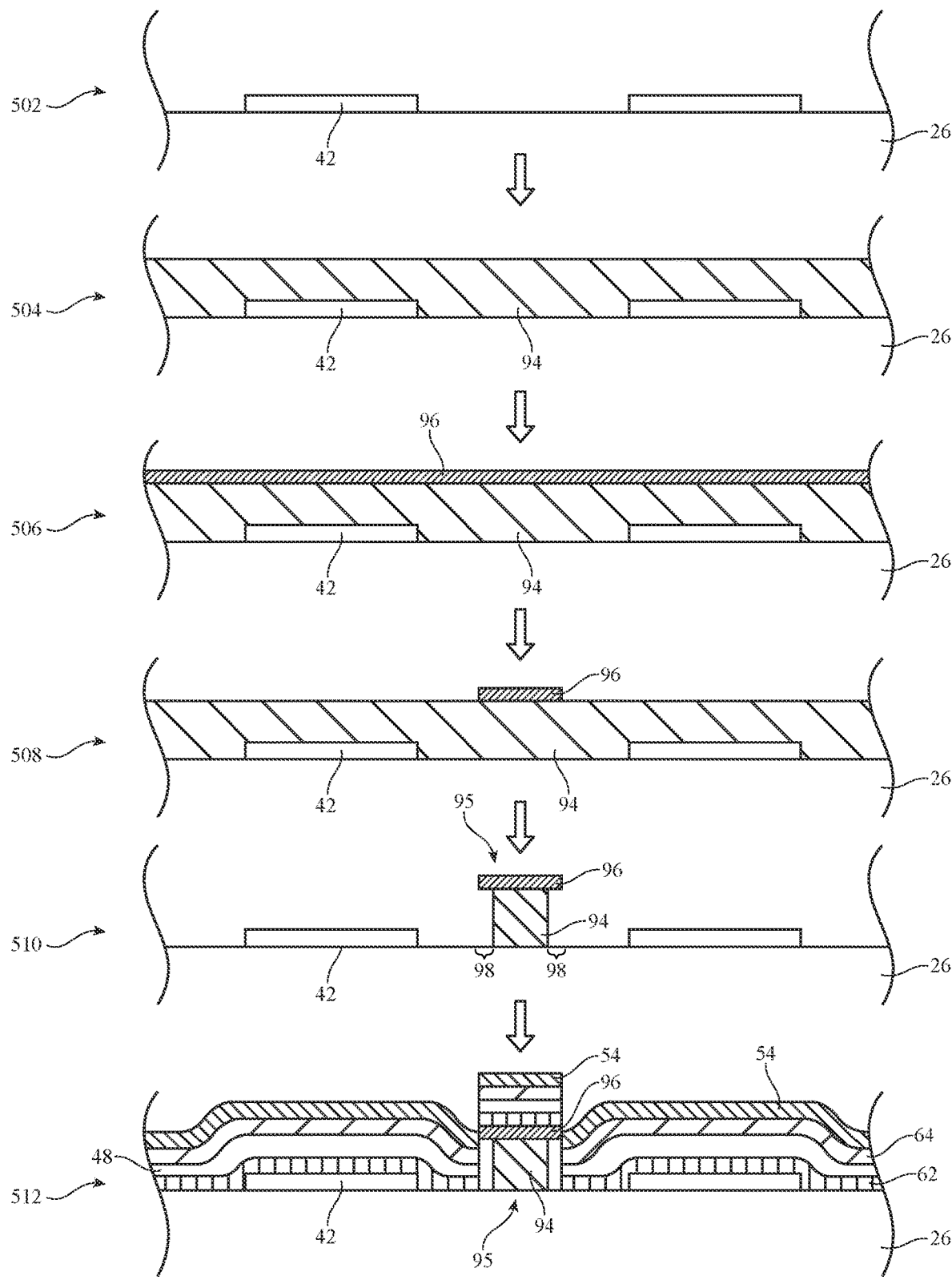
FIG. 14 is a cross-sectional side view of an illustrative organic light-emitting diode display with a T-shaped structure interposed between adjacent anodes in accordance with an embodiment.

FIG. 14 shows an illustrative method of reducing lateral leakage in an organic light-emitting diode display by forming an insulating structure between anodes of the organic light-emitting diode display. At step 502, anodes 42 may be formed on substrate 26. Next at step 504, an insulating layer 94 may be formed as a blanket layer across the entire display. Insulating layer 94 may be formed from any desired insulating material. After depositing insulating layer 94, an additional layer 96 may be formed over insulating layer 94. Layer 96 may be formed as a blanket layer across the entire display. Layer 96 may be formed from a conductive material or an insulating material. At step 508, layer 96 may be etched to remove portions of layer 96 over anodes 42. Portions of layer 96 may remain in the regions between adjacent anodes in the display. Insulating layer 94 may then be etched at step 510. If desired, layer 96 may act as a masking layer for the etch of insulating layer 94. Alternatively, an additional masking layer may be used if desired. The etch of insulating layer 94 may be a slight isotropic etch that causes portions of insulating layer 94 in regions 98 to be removed. The resulting structure (i.e., structure 95) between anodes 42 may have a T-shape, with overhanging portions of layer 96 that do not overlap insulating layer 94. The insulating structure 95 may break the continuity of the OLED layers between anodes 42, reducing lateral leakage in the display.

Step 512 shows a cross-sectional side view of the organic light-emitting diode display after the OLED layers and cathode 54 are formed over the anodes and the insulating structure. As shown, hole layer 62, emissive layer 48, electron layer 64, and cathode 54 may be deposited as blanket layers across the entire array. Therefore, each layer has a portion on the insulating structure 95 and another portion over the anodes 42. For example, hole layer 62 may have first portions that overlap and directly contact anodes 42 and a second portion that overlaps and directly contacts structure 95. Emissive layer 48 may have first portions that overlap and directly contact the first portions of hole layer 62 and a second portion that overlaps and directly contacts the second portion of hole layer 62. Electron layer 64 may have first portions that overlap and directly contact the first portions of emissive layer 48 and a second portion that overlaps and directly contacts the second portion of emissive layer 48. Cathode 54 may have first portions that overlap and directly contact the first portions of electron layer 64 and a second portion that overlaps and directly contacts the second portion of electron layer 64.

In order to maintain continuity of cathode 54, layer 96 of structure 95 may be formed from a conductive material. Therefore, when the thickness of the layers is selected appropriately, the portions of cathode 54 that overlap the anodes may directly contact and be electrically connected by layer 96. Layer 96 may also reduce lateral resistivity of cathode 54, which may help reduce power consumption in the display.

Figure 15:
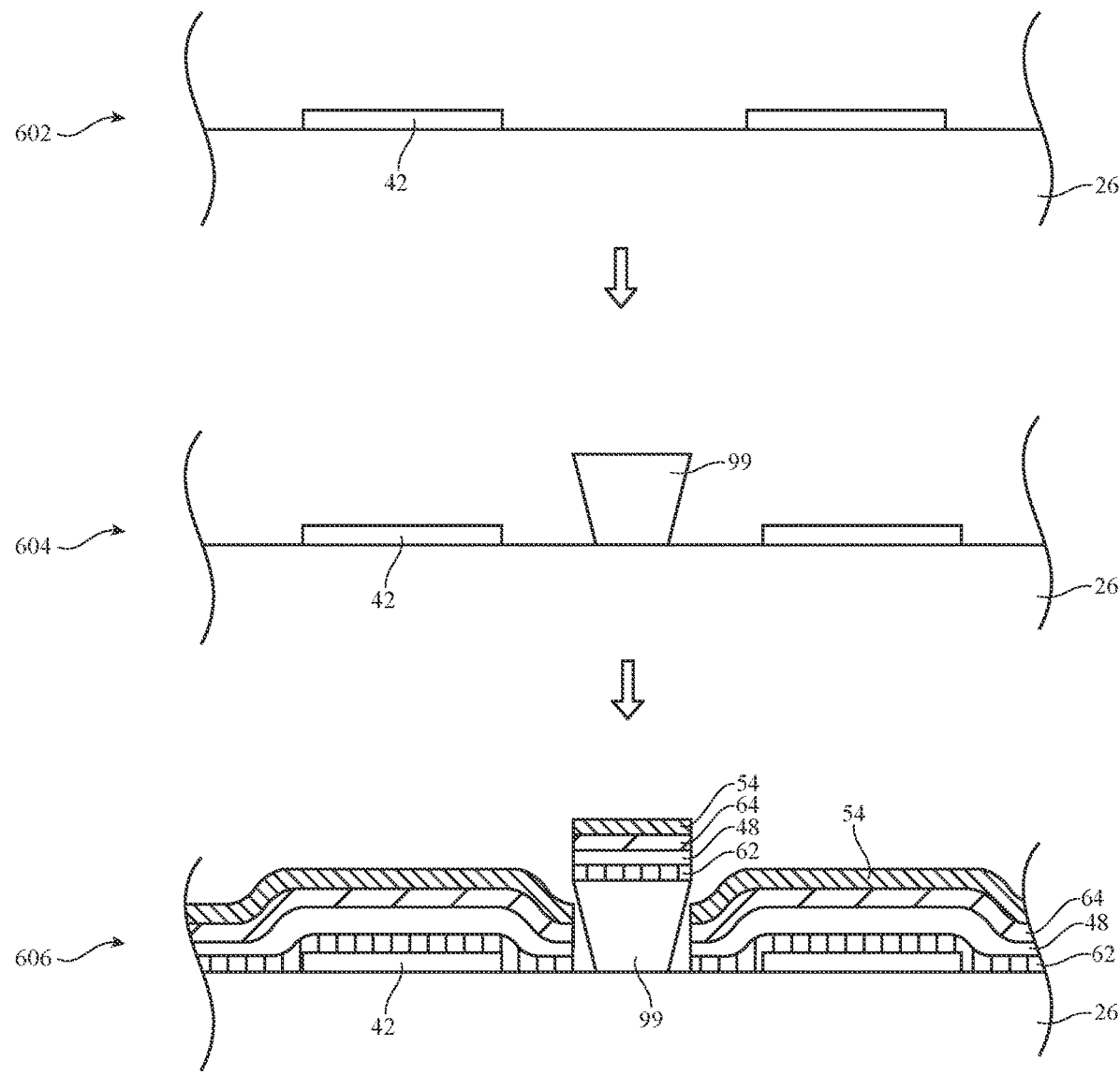
FIG. 15 is a cross-sectional side view of an illustrative organic light-emitting diode display with a tapered insulating structure interposed between adjacent anodes in accordance with an embodiment.

FIG. 15 shows an illustrative method of forming an organic light-emitting diode display with a tapered insulating structure for reduced lateral leakage. At step 602, anodes 42 may be formed on substrate 26. Next at step 604, insulating structure 99 may be formed between adjacent anodes 42 within the display. Insulating structure 99 may be formed from any desired insulating material. Insulating structure 99 may have a tapered shape. The upper surface of insulating structure 99 may have a first width whereas the lower surface of insulating structure 99 may have a second width that is smaller than the first width. The insulating structure may have a trapezoidal cross-sectional shape. The insulating structure may have a height of less than 3 microns, less than 5 microns, less than 10 microns, more than 1 micron, between 1 and 5 microns, or any other desired height. These examples of size and shape for insulating structure 99 are merely illustrative. Insulating structure 99 may have any desired shape and dimensions.

At step 606, the OLED layers and cathode may be formed as blanket layers across the display. The presence of insulating structure 99 may cause the continuity of the OLED layers to be disrupted, reducing lateral leakage between anodes through the OLED layers. As shown in the cross-sectional side view of FIG. 15, hole layer 62 may have first portions that overlap and directly contact anodes 42 and a second portion that overlaps and directly contacts insulating structure 99. Emissive layer 48 may have first portions that overlap and directly contact the first portions of hole layer 62 and a second portion that overlaps and directly contacts the second portion of hole layer 62. Electron layer 64 may have first portions that overlap and directly contact the first portions of emissive layer 48 and a second portion that overlaps and directly contacts the second portion of emissive layer 48. Cathode 54 may have first portions that overlap and directly contact the first portions of electron layer 64 and a second portion that overlaps and directly contacts the second portion of electron layer 64.

Figure 16:
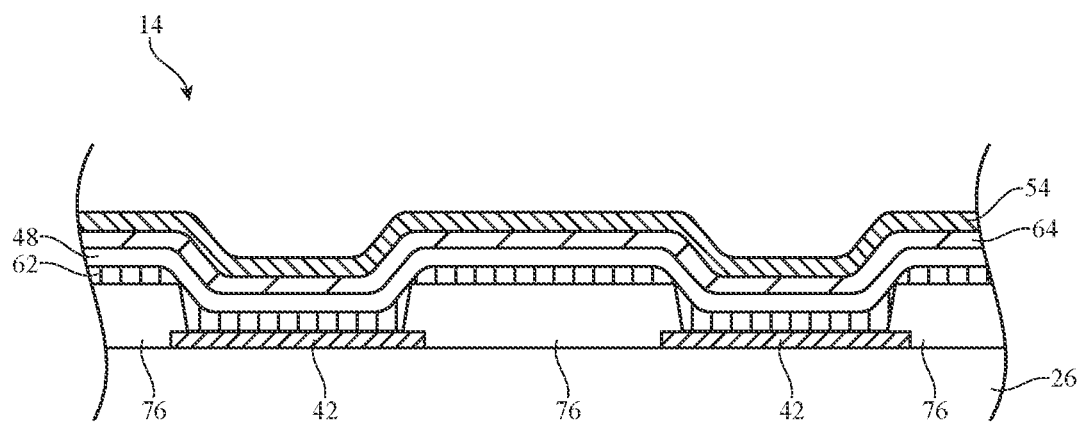
FIG. 16 is a cross-sectional side view of an illustrative organic light-emitting diode display with a pixel definition layer that disrupts continuity of an organic light-emitting diode layer in accordance with an embodiment.

Previous examples have been described (e.g., FIG. 14 and FIG. 15) where a structure is included between adjacent anodes 42 to disrupt the continuity of a hole layer (62), thereby reducing lateral leakage between the anodes. In another illustrative example, a pixel definition layer may be used to disrupt the continuity of hole layer 62 between adjacent anodes. FIG. 16 is a cross-sectional side view of an illustrative organic light-emitting diode display with a pixel definition layer that disrupts the continuity of hole layer 62.

As shown in FIG. 16, pixel definition layer 76 may be formed on substrate 26 between the anodes of the display. The pixel definition layer may be opaque and therefore may define the area of each pixel that emits light. The pixel definitional layers may be formed from any desired material. The pixel definition layers may be formed from one or more materials (e.g., silicon nitride, silicon dioxide, etc.). The pixel definitional layers may also be formed from an organic material if desired. The shape of each pixel definitional layer may create discontinuities in the overlying organic light-emitting diode display layers. As previously discussed, it may be desirable to create discontinuities in hole layer 62 (to prevent lateral leakage through hole layer 62). However, it may also be desirable to maintain continuity in one or more other layers in the display (e.g., cathode 54). Therefore, the shape of the pixel definition layers may be designed such that the hole layer 62 deposited over the pixel definition layer has discontinuities whereas cathode 54 deposited over the pixel definition layers does not have discontinuities. Emissive layer 48 and electron layer 64 may optionally have discontinuities. The pixel definition layer 76 may have any desired shape to help achieve these discontinuities and continuities. For example, each pixel definition layer may have a steep sidewall, a sidewall with an undercut, or a sidewall with a plurality of curves (e.g., sidewall scalloping).

Figure 17:
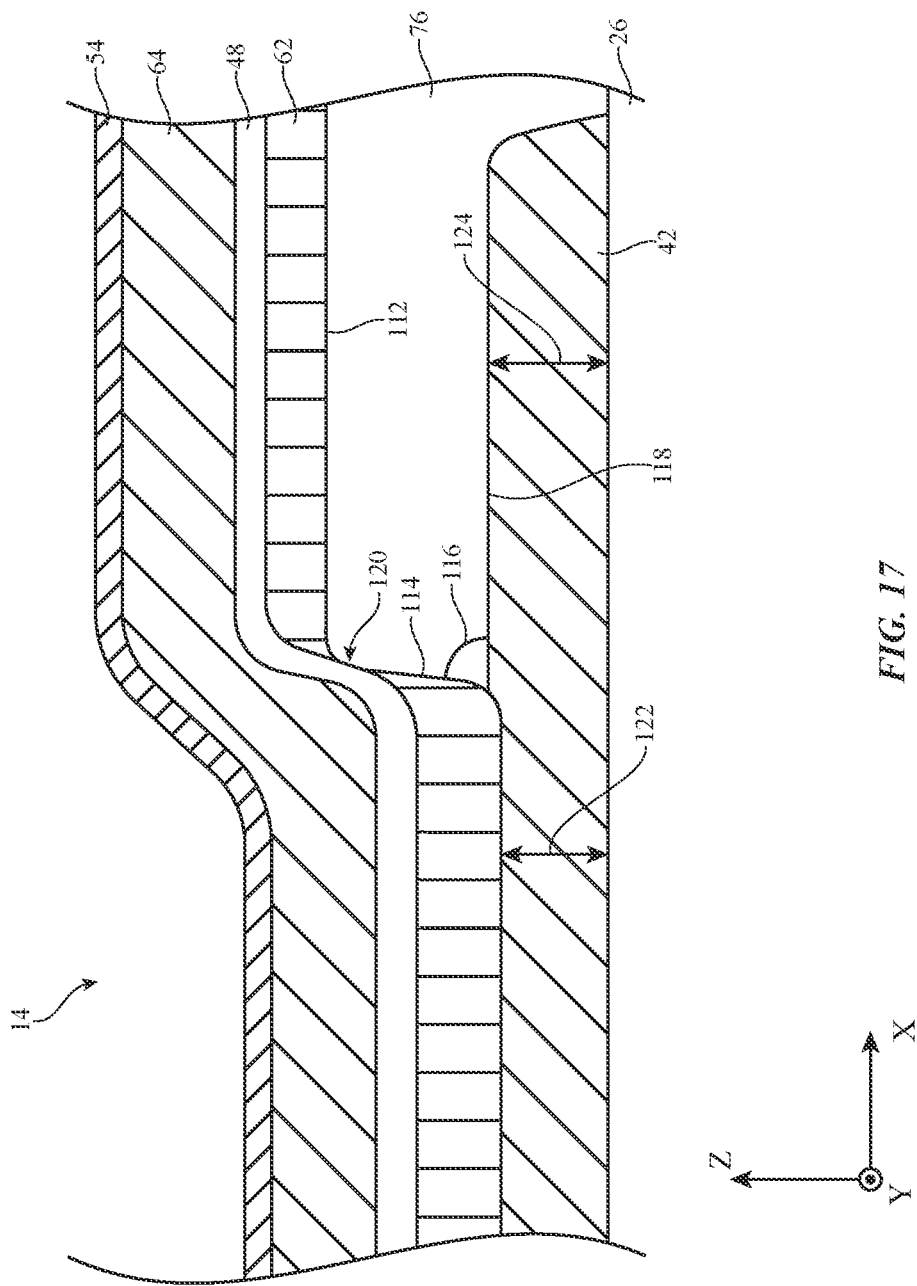
FIG. 17 is a cross-sectional side view of an illustrative organic light-emitting diode display with a pixel definition layer that has a steep sidewall to disrupt continuity of an organic light-emitting diode layer in accordance with an embodiment.

FIG. 17 is a cross-sectional side view of an illustrative organic light-emitting diode display with a pixel definition layer that has a steep sidewall to disrupt continuity of the hole layer. As shown, pixel definition layer 76 has an upper (top) surface 112 and a sidewall surface 114 (sometimes referred to as a sidewall, side surface, or edge surface). Sidewall surface 114 may be at an angle 116 relative to the upper surface 118 of anode 42. Upper surface 118 of anode 42 may be parallel to upper surface 112 of pixel definition layer 76. Angle 116 may be any desired angle (e.g., greater than 70°, greater than 75°, greater than 80°, greater than 85°, greater than 88°, greater than 90°, greater than 95°, less than 70°, less than 75°, less than 80°, less than 85°, less than 88°, less than 90°, less than 95°, between 75° and 90°, between 80° and 90°, between 85° and 90°, etc.). As shown in FIG. 17, when hole layer 62 is deposited over pixel definition layer 76, discontinuity 120 is created. In this way, hole layer 62 may have a first portion formed on a first side of the discontinuity (e.g., the portion over upper surface 112 of PDL 76) and a second portion formed on a second, opposing, side of the discontinuity that is electrically isolated from the first portion. The portion of hole layer 62 over a first pixel may therefore be electrically isolated from the portion of hole layer 62 over a second, adjacent pixel. Additionally, as shown in FIG. 17, discontinuity 120 does not extend to cathode layer 54. Maintaining the continuity of cathode layer 54 ensures proper operation of the organic light-emitting diode display.

If desired, anode 42 may have portions with different heights to help achieve the desired discontinuities and continuities in the organic light-emitting diode layers. As shown in FIG. 17, anode 42 may have a first height 122 in a first region (e.g., the portion of the anode that is not overlapped by pixel definition layer 76) and may have a second height 124 in a second region (e.g., the portion of the anode that is overlapped by pixel definition layer 76). The second height 124 may be greater than the first height 122. This example is merely illustrative. Anode 42 may have an upper surface with the same height across the anode if desired. For all of the embodiments herein, the anodes may have a height that is consistent across the upper surface of the anode or may have one or more portions with different heights.

Figure 18:
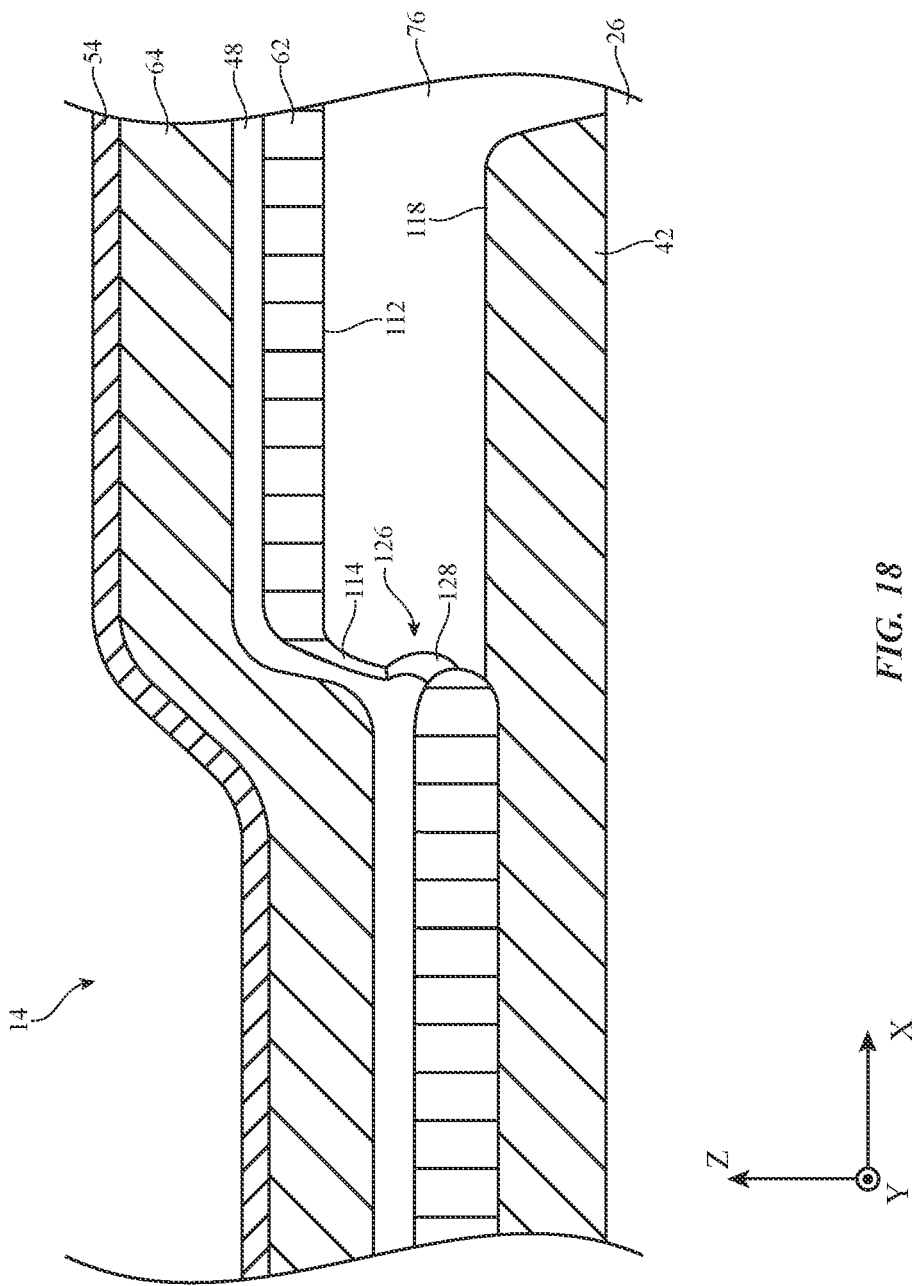
FIG. 18 is a cross-sectional side view of an illustrative organic light-emitting diode display with a pixel definition layer that has an undercut to disrupt continuity of an organic light-emitting diode layer in accordance with an embodiment.

FIG. 18 is a cross-sectional side view of an illustrative organic light-emitting diode display with a pixel definition layer that has an undercut to disrupt continuity of the hole layer. As shown in FIG. 18, pixel definition layer 76 has an upper (top) surface 112 and a sidewall surface 114 (sometimes referred to as a sidewall, side surface, or edge surface). Sidewall 114 has an undercut 126 that helps create a discontinuity in the hole layer 62. Undercut 126 may be considered a recess in sidewall 114. Sidewall 114 may extend vertically downwards (e.g., in the negative Z-direction). Above undercut 126, the sidewall may also extend in the negative X-direction. To form undercut 126, the sidewall may extend in the positive X-direction. In this way, a portion of pixel definition layer 76 may overlap recess 128. As shown in FIG. 18, when hole layer 62 is deposited over pixel definition layer 76, undercut 126 creates a discontinuity. Hole layer 62 may have a first portion formed on a first side of the discontinuity (e.g., the portion over upper surface 112 of PDL 76) and a second portion formed on a second, opposing, side of the discontinuity that is electrically isolated from the first portion. The portion of hole layer 62 over a first pixel may therefore be electrically isolated from the portion of hole layer 62 over a second, adjacent pixel. Additionally, as shown in FIG. 18, emissive layer 48, electron layer 64, and cathode layer 54 remain continuous (in spite of the presence of undercut 126). Maintaining the continuity of cathode layer 54 ensures proper operation of the organic light-emitting diode display.

In the example of FIG. 18, pixel definition layer 76 is depicted as a single layer of material. However, to help form the desired undercut shape in the sidewall of the pixel definition layer, the pixel definition layer may be formed from multiple layers of material.

Figure 19:
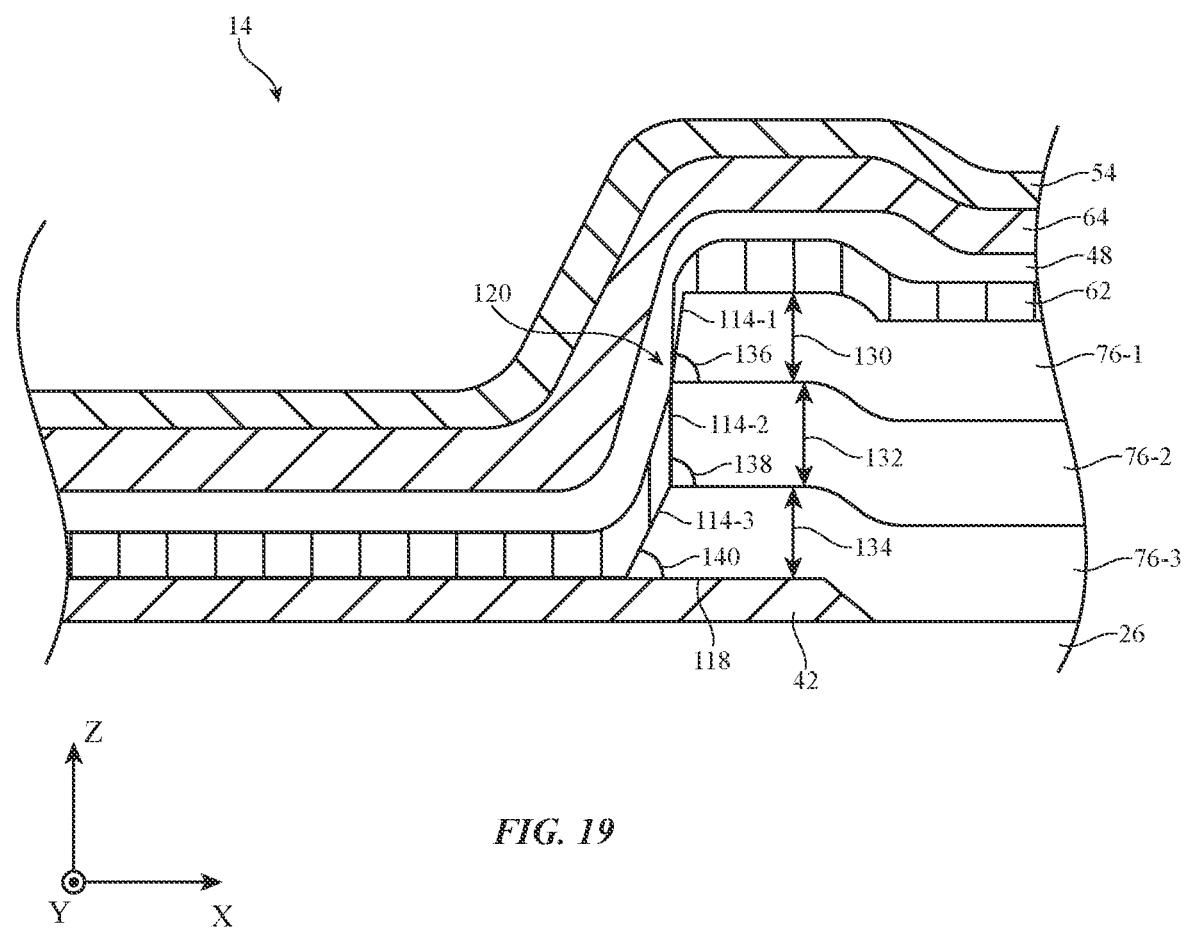
FIG. 19 is a cross-sectional side view of an illustrative organic light-emitting diode display with a pixel definition layer that has multiple layers that form a sidewall surface that disrupts continuity of an organic light-emitting diode layer in accordance with an embodiment.

FIG. 19 is a cross-sectional side view of an illustrative organic light-emitting diode display with a pixel definition layer that has multiple layers to form a desired sidewall surface that disrupts continuity of the hole layer. The pixel definition layer may be formed by depositing one or more layers of material then etching the one or more layers of material. The etched layers and the etching process may have various properties (e.g., the type of material deposited, the thickness of the material deposited, the selectivity of the etching process, etc.) that can be tuned to achieve a desired sidewall shape. FIG. 19 shows an example where pixel definition layer 76 includes a first layer 76-1, a second layer 76-2, and a third layer 76-3. The first, second, and third layers may be formed from any desired materials. In one illustrative example, layer 76-1 is formed from silicon dioxide, layer 76-2 is formed from silicon nitride, and layer 76-3 is formed from silicon dioxide.

Pixel definition layers 76-1, 76-2, and 76-3 may have any desired thicknesses. As shown in FIG. 19, layer 76-1 has a first thickness 130, layer 76-2 has a second thickness 132, and layer 76-3 has a third thickness 134. The thicknesses may be the same or may be different. In one illustrative example, thickness 132 may be the same as thickness 134, whereas thickness 130 may be different (e.g., less) than thicknesses 132 and 134. In another illustrative example, thicknesses 130, 132, and 134 may all be the same. Each thickness may be any desired distance (e.g., less than 10 micron, less than 1 micron, less than 100 nanometers, less than 80 nanometers, less than 60 nanometers, less than 40 nanometers, less than 30 nanometers, less than 20 nanometers, greater than 10 micron, greater than 1 micron, greater than 100 nanometers, greater than 80 nanometers, greater than 60 nanometers, greater than 40 nanometers, greater than 30 nanometers, greater than 20 nanometers, between 20 nanometers and 100 nanometers, between 20 nanometers and 80 nanometers, between 20 nanometers and 60 nanometers, between 40 nanometers and 60 nanometers, between 20 nanometers and 40 nanometers, etc.). In one example, layer 76-1 may have a thickness of 30 nanometers, layer 76-2 may have a thickness of 55 nanometers, and layer 76-3 may have a thickness of 55 nanometers. In another example, layer 76-1 may have a thickness of 55 nanometers, layer 76-2 may have a thickness of 55 nanometers, and layer 76-3 may have a thickness of 55 nanometers.

Pixel definition layers 76-1, 76-2, and 76-3 may be etched to have any desired sidewall angle. Each pixel definitional layer may have a corresponding sidewall portion. As shown in FIG. 19, layer 76-1 has a sidewall portion 114-1, layer 76-2 has a sidewall portion 114-2, and layer 76-3 has a sidewall portion 114-3. Sidewall portions 114-1, 114-2, and 114-3 may combine to form the sidewall (114) for the pixel definition layer. Each sidewall portion may be planar and positioned at a respective angle relative to the X-axis (which is parallel to upper surface 118 of anode 42). Sidewall portion 114-1 is positioned at angle 136 relative to the X-axis, sidewall portion 114-2 is positioned at angle 138 relative to the X-axis, and sidewall portion 114-3 is positioned at angle 140 relative to the X-axis. Angles 136, 138, and 140 may each be any desired angle (e.g., 30°, 60°, 80°, 100°, between 20° and 40°, between 50° and 70°, between 95° and 110°, greater than 20°, greater than 45°, greater than 60°, greater than 80°, greater than 90°, greater than 95°, greater than 100°, greater than 120°, less than 20°, less than 45°, less than 60°, less than 80°, less than 90°, less than 95°, less than 100°, less than 120°, etc.). In one illustrative arrangement, angle 136 may be 60°, angle 138 may be 100°, and angle 140 may be 30°. This type of arrangement (e.g., where angle 138 is greater than 90°) results in an undercut similar to as described in connection with FIG. 18. The undercut creates discontinuity 120 when hole layer 62 is deposited over pixel definition layer 76. In this way, hole layer 62 may have a first portion formed on a first side of the discontinuity (e.g., the portion over PDL 76) and a second portion formed on a second, opposing, side of the discontinuity that is electrically isolated from the first portion. The portion of hole layer 62 over a first pixel may therefore be electrically isolated from the portion of hole layer 62 over a second, adjacent pixel. Additionally, as shown in FIG. 19, emissive layer 48, electron layer 64, and cathode layer 54 remain continuous. Maintaining the continuity of cathode layer 54 ensures proper operation of the organic light-emitting diode display.

Figure 20:
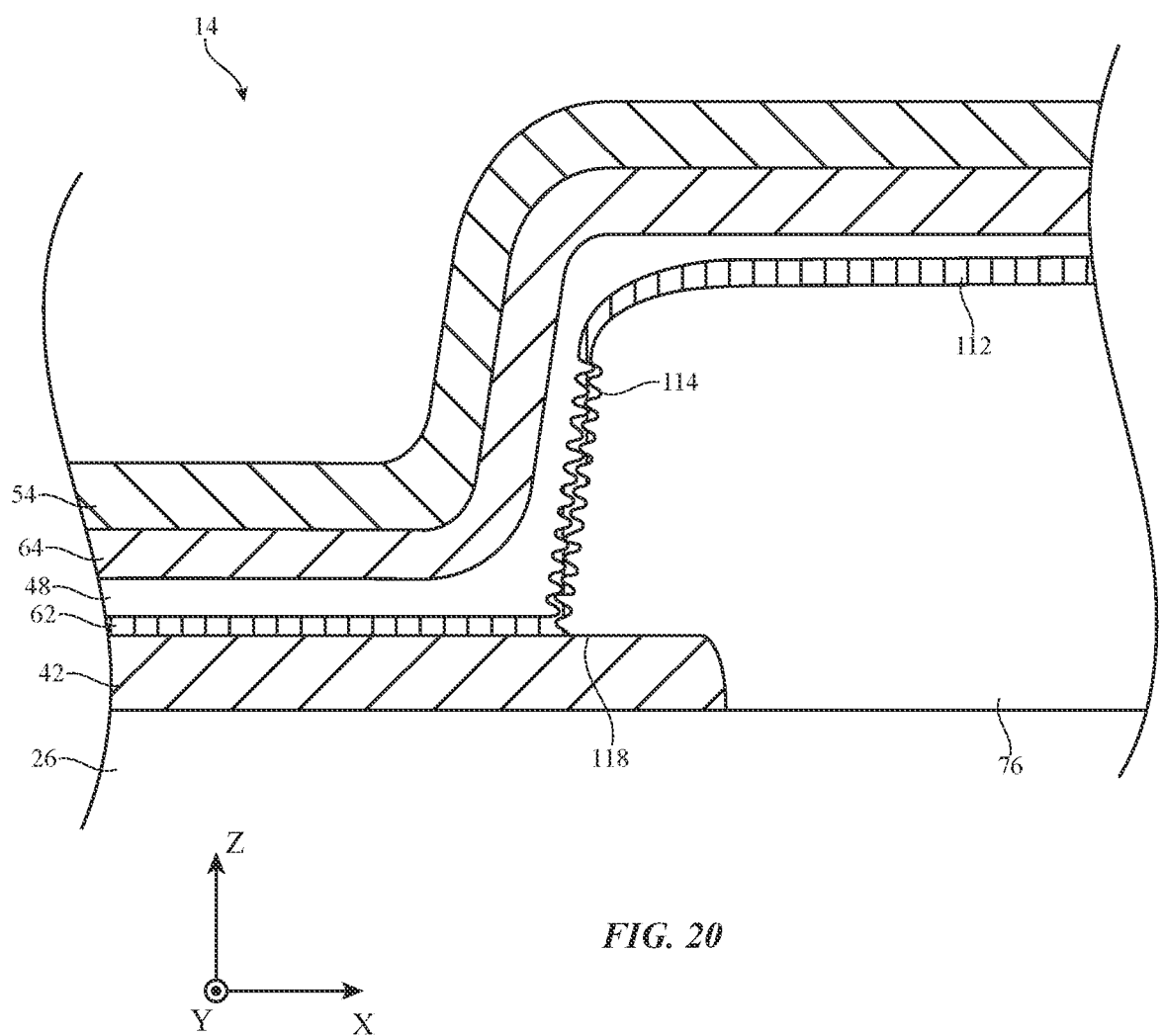
FIG. 20 is a cross-sectional side view of an illustrative organic light-emitting diode display with a pixel definition layer that has a sidewall surface with curves that disrupts continuity of an organic light-emitting diode layer in accordance with an embodiment.

FIG. 20 is a cross-sectional side view of an illustrative organic light-emitting diode display with a pixel definition layer that has a sidewall surface with curves that disrupt continuity of the hole layer. To form a pixel definition layer with this type of sidewall, the pixel definition layer may be formed from an organic dielectric material. The organic dielectric material may be patterned using photolithography (e.g., exposure to light). To form the curves shown in FIG. 20, the light for patterning pixel definition layer 76 may be emitted in the negative Z-direction such that the light reflects off of the upper surface 118 of anode 42. The wavelength of the light and the thickness of pixel definition layer 76 may be controlled such that a standing wave is created (due to a thin film interference effect). The sidewall profile will then reflect the shape of the standing wave, resulting in sidewall surface 114 having curves. Sidewall surface 114 may sometimes be referred to as having a scalloped shape or sinusoidal shape. The sinusoidal surface of sidewall 114 creates a discontinuity when hole layer 62 is deposited over pixel definition layer 76. Hole layer 62 may have a first portion formed on a first side of the discontinuity (e.g., the portion over PDL 76) and a second portion formed on a second, opposing, side of the discontinuity that is electrically isolated from the first portion. The portion of hole layer 62 over a first pixel may therefore be electrically isolated from the portion of hole layer 62 over a second, adjacent pixel. Additionally, as shown in FIG. 20, emissive layer 48, electron layer 64, and cathode layer 54 remain continuous. Maintaining the continuity of cathode layer 54 ensures proper operation of the organic light-emitting diode display.

Figure 21:
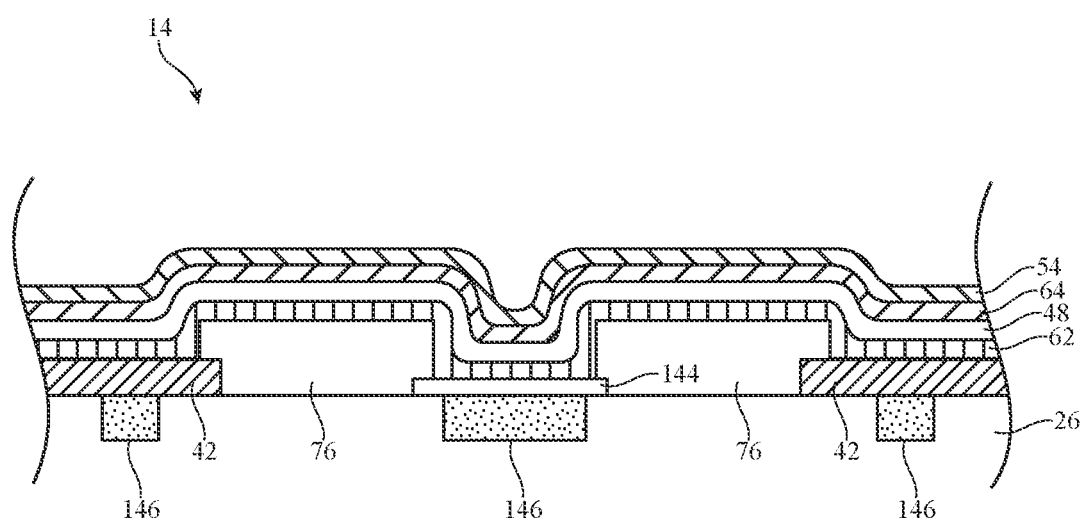
FIG. 21 is a cross-sectional side view of an illustrative organic light-emitting diode display with a control gate that is coplanar with an anode contact and that forms a p-type field effect transistor (FET) to eliminate lateral leakage in accordance with an embodiment.

FIG. 21 is a cross-sectional side view of an illustrative organic light-emitting diode display with a control gate that forms a p-type field effect transistor (FET) to eliminate lateral leakage. As shown in FIG. 21, display 14 includes anodes 42 on substrate 26. Hole layer 62 (which may include a hole transport layer and a hole injection layer), emissive layer 48, electron layer 64 (which may include an electron transport layer and an electron injection layer), and common electrode layer 54 (e.g., a cathode) are formed over anodes 42. A pixel definition layer 76 is also formed between anodes 42. In this embodiment, a control gate is also included in the display to form an organic thin-film transistor. As shown in FIG. 21, control gate 142 may be formed between adjacent anodes 42. The control gate may be covered by dielectric material 144 (e.g., gate dielectric) that insulates the control gate (below the gate dielectric) from hole layer 62 (above the gate dielectric). Dielectric material 144 may be formed from any desired material (e.g., silicon dioxide). When a bias voltage (e.g., a positive bias voltage) is applied to gate 142, the current channel formed by hole layer 62 may be electrically shut off, thereby preventing lateral leakage between adjacent anodes. Pixel definition layer 76 may be patterned such that the pixel definition layer 76 does not overlap control gate 142. Said another way, the pixel definition layer 76 may have a recess (also sometimes referred to as an opening, slot, or hole) that overlaps the control gate.

Control gate 142 may be a conductive layer formed from any desired conductive material. For example, control gate 142 may be formed from aluminum, indium tin oxide (ITO), or another desired conductive material. In some embodiments, control gate 142 may be formed from the same material as another layer in the display. This may allow for faster and less expensive manufacturing (because a single manufacturing step can be used to form the control gate and another layer in the display). In the example of FIG. 21, control gate 142 is formed in the same layer as anode contacts 146. Contacts 146 may be conductive layers that are used to contact (e.g., provide a signal to) a respective anode 42. Conductive layer 142 may be formed from the same material as contacts 146, may be formed during the same manufacturing step as contacts 146, may be formed using the same mask as contacts 146, and/or may be formed in the same plane as contacts 146 (e.g., such that conductive layer 142 and contacts 146 are coplanar).

Figure 22:
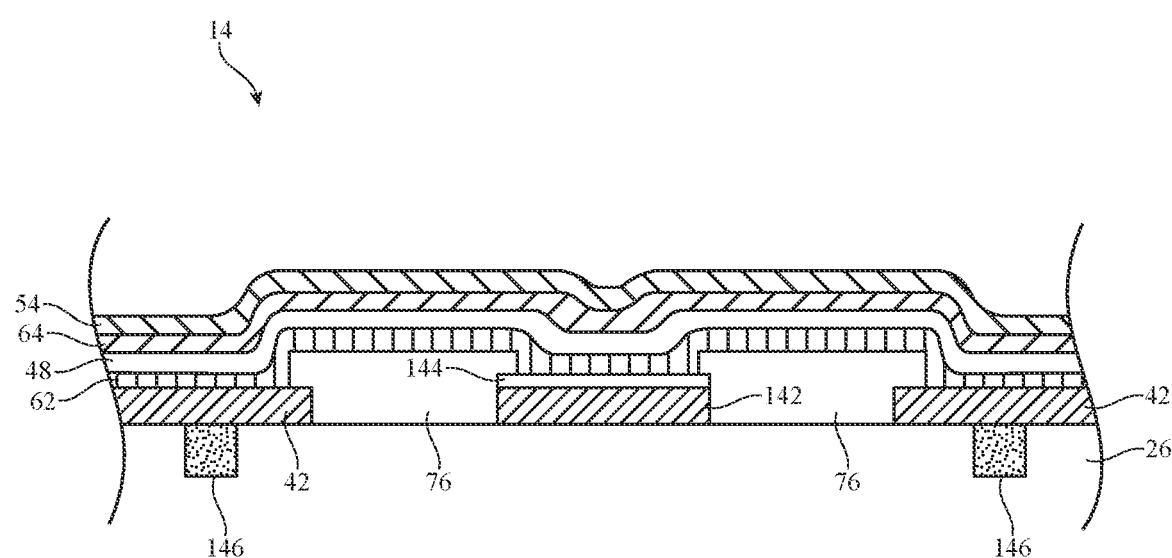
FIG. 22 is a cross-sectional side view of an illustrative organic light-emitting diode display with a control gate that is coplanar with an anode and that forms a p-type field effect transistor (FET) to eliminate lateral leakage in accordance with an embodiment.

The example of control gate 142 being formed from the same layer as contacts 146 is merely illustrative. In another embodiment, shown in FIG. 22, control gate 142 may be formed from the same layer as anodes 42. Conductive layer 142 may be formed from the same material as anodes 42, may be formed during the same manufacturing step as anodes 42, may be formed using the same mask as anodes 42, and/or may be formed in the same plane as anodes 42 (e.g., such that conductive layer 142 and anodes 42 are coplanar). In one illustrative example, both layer 142 and anodes 42 may be formed from aluminum. Similar to as discussed above in connection with FIG. 21, the pixel definition layer in FIG. 22 has an opening that overlaps control gate 142. Dielectric layer 144 may have first and second opposing sides, with the first side directly contacting hole layer 62 and the second side directly contacting control gate 142. Dielectric layer may also directly contact pixel definition layer 76 if desired (e.g., a first edge of the dielectric layer may contact a first portion of the pixel definition layer whereas a second edge of the dielectric layer may contact a second portion of the pixel definition layer). In the embodiments of FIGS. 21 and 22, pixel definition layer 76 may be formed from an organic material (sometimes referred to as an organic film).

Figure 23:
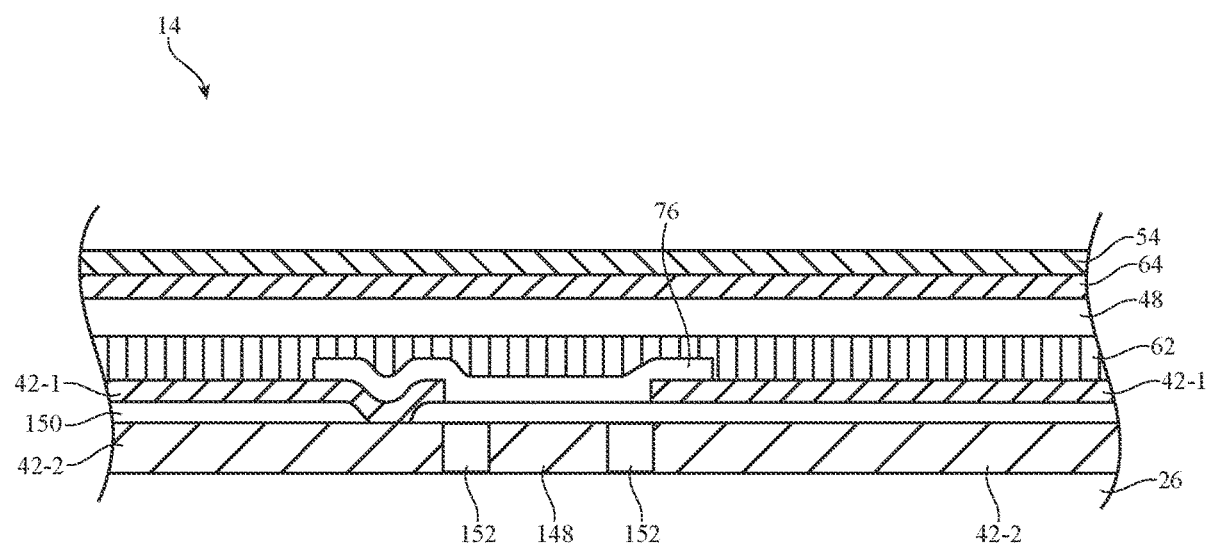
FIG. 23 is a cross-sectional side view of an illustrative organic light-emitting diode display with a control gate that is covered by a pixel definition layer and that forms a p-type organic thin-film transistor (TFT) to eliminate lateral leakage in accordance with an embodiment.

FIG. 23 is a cross-sectional side view of an illustrative organic light-emitting diode display with a control gate that forms a p-type organic thin-film transistor (TFT) to eliminate lateral leakage. In the embodiment of FIG. 23, display 14 includes anodes formed from multiple layers of metal. For example, each anode has a first layer 42-1 and a second layer 42-2 that are electrically connected (e.g., layer 42-1 directly contacts layer 42-2 through an opening in dielectric layer 150). The first layer 42-1 may be formed from the same material as second layer 42-2 or a different material than second layer 42-2. In one illustrative embodiment, anode layer 42-1 is formed from indium tin oxide (ITO) whereas anode layer 42-2 is formed from aluminum. This example is merely illustrative, and each anode layer may be formed from any desired material.

As shown in FIG. 23, a control gate is also included in the display to form an organic thin-film transistor. As shown in FIG. 23, control gate 148 (sometimes referred to as a conductive layer) may be formed between adjacent anodes 42. Specifically, control gate 148 may be formed between the second layers 42-2 of adjacent anodes. Conductive layer 148 may be formed from the same material as anode layers 42-2, may be formed during the same manufacturing step as anode layers 42-2, may be formed using the same mask as anode layers 42-2, and/or may be formed in the same plane as anode layers 42-2 (e.g., such that conductive layer 148 and anode layers 42-2 are coplanar). To insulate control gate 148 (ensuring control gate 148 is not electrically connected to an adjacent anode), an insulating layer 152 may be interposed between the control gate and the anodes. Insulating layer 152 (sometimes referred to as dielectric layer 152 or planarization layer 152) may be formed from silicon dioxide ($SiO_2$) or another desired dielectric material. The control gate may be covered by dielectric material 150 (e.g., gate dielectric) that insulates the control gate and is interposed between anode layers 42-1 and 42-2. Dielectric material 150 may be formed from any desired material (e.g., silicon dioxide). When a bias voltage (e.g., a positive bias voltage) is applied to gate 148, the current channel formed by hole layer 62 may be electrically shut off, thereby preventing lateral leakage between adjacent anodes. Pixel definition layer 76 (which may be formed from an organic material) is also formed over control gate 148. Dielectric layer 150 may be interposed between and in direct contact with control gate 148 and pixel definition layer 76.

In the arrangement of FIG. 23, control gate 148 is separated from hole layer 62 by dielectric layer 150 and pixel definition layer 76. The thickness of these layers may be proportional to the positive bias voltage required for control gate 148 to reduce lateral leakage between adjacent anodes.

Figure 24:
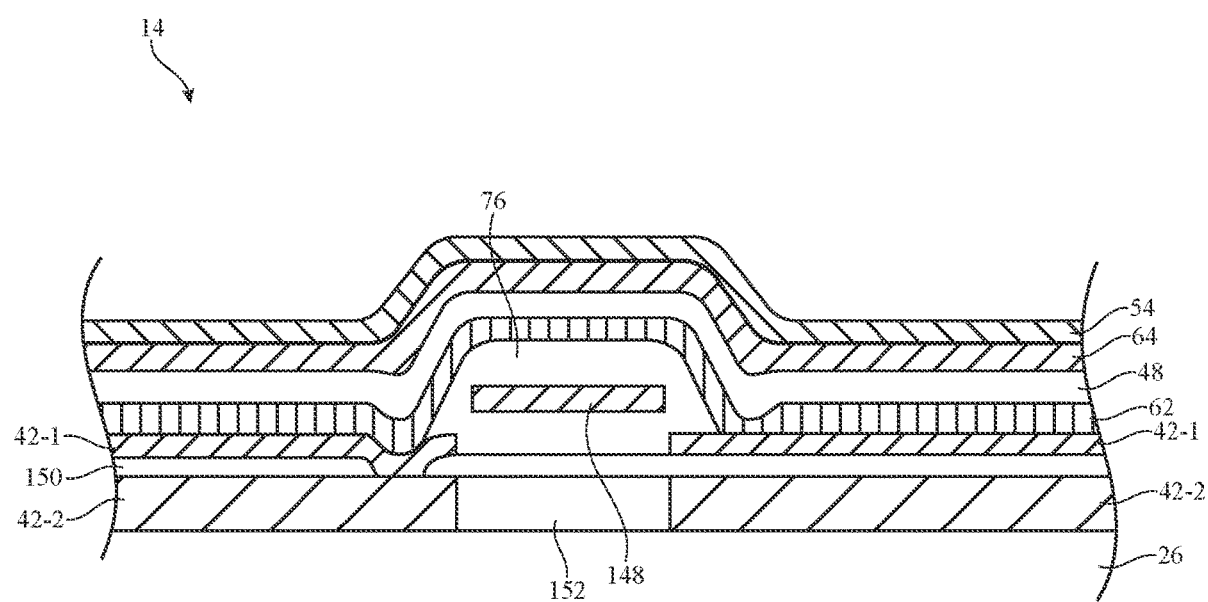
FIG. 24 is a cross-sectional side view of an illustrative organic light-emitting diode display with a control gate that is embedded within a pixel definition layer and that receives a positive bias voltage to eliminate lateral leakage in accordance with an embodiment.

As shown in FIG. 24, the organic light-emitting diode display may include a control gate 148 that is formed within pixel definition layer 76. When applying a positive bias voltage to control gate 148, the current channel formed by hole layer 62 may be electrically shut off, thereby preventing lateral leakage between adjacent anodes. The thinnest portions of hole layer 62 may be adjacent to pixel definition layer 76. Therefore, forming control gate 148 in pixel definition layer 76 may allow control gate 148 to control the current channel at its thinnest point, maximizing the reduction of leakage current. The arrangement of FIG. 24 may also allow control gate 148 to be formed as separate layer than anode layer 42-2 (or anode layer 42-1). In some circumstances this may make manufacturing the display easier. Additionally, the location of control gate 148 in FIG. 24 confines holes within the active pixel area and therefore reduces edge emission.

As shown in FIG. 24, control gate 148 may be embedded in pixel definition layer 76. The control gate may be completely surrounded by pixel definition layer 76 (e.g., such that all surfaces of the control gate are in direct contact with pixel definition layer 76). Pixel definition layer 76 may be formed from any desired material (e.g., silicon dioxide). To embed control gate 148 in pixel definition layer 76, pixel definition layer 76 may be formed using multiple deposition steps (e.g., a first layer is deposited underneath the control gate, a second layer is deposited over the control gate, and a third layer is deposited on the edges of the control gate).

The example in FIGS. 23 and 24 of anode 42 being formed from two layers is merely illustrative. The anode of organic light-emitting diode display 14 (in all embodiments herein) may be formed from any desired number of layers. The control gates shown in FIGS. 23 and 24 may be used in a display with a single-layer anode or multi-layer anode.

FIGS. 21-24 have all shown embodiments where an organic light-emitting diode display includes a control gate that is used to control lateral leakage between adjacent anodes in the display. These control gates may be arranged in grids, columns, or other desired patterns.

Figure 25:
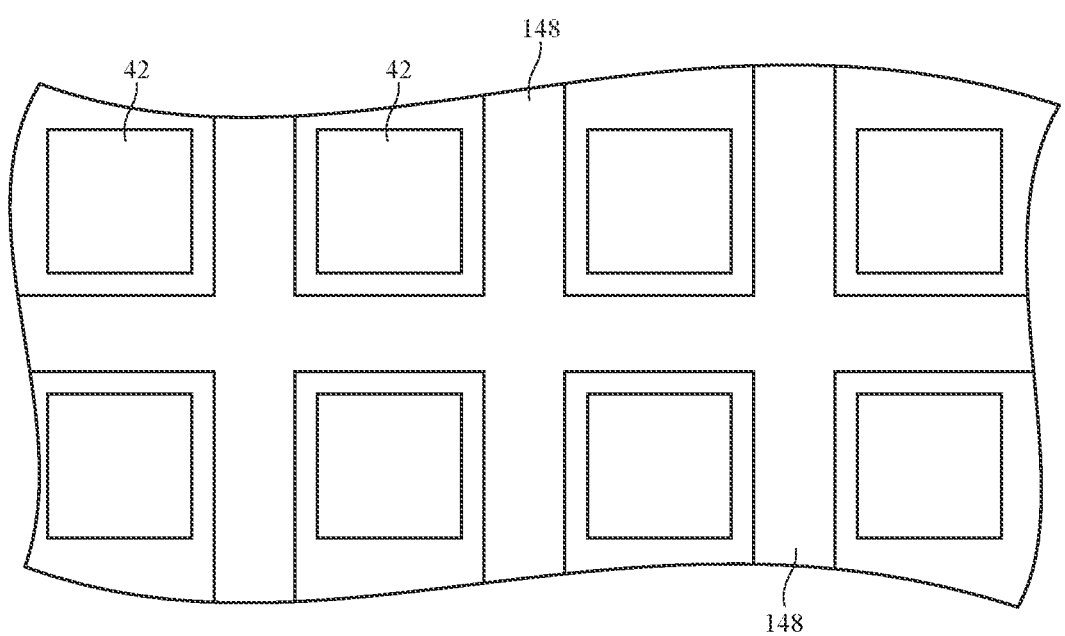
FIG. 25 is a top view of an illustrative organic light-emitting diode display showing control gates arranged in a grid in accordance with an embodiment.
Figure 26:
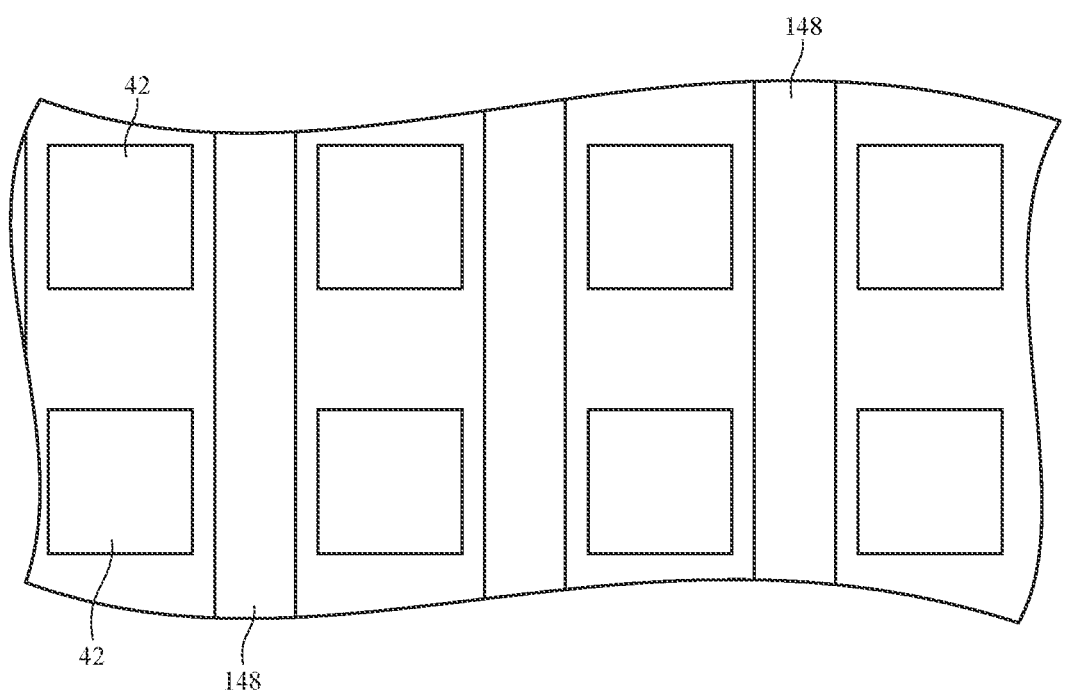
FIG. 26 is a top view of an illustrative organic light-emitting diode display showing control gates arranged in columns in accordance with an embodiment.

FIGS. 25 and 26 are top views of illustrative organic light-emitting diode displays showing arrangements for control gates. As shown in FIG. 25, the control gate (e.g., control gate 142 in FIGS. 21 and 22 or control gate 148 in FIGS. 23 and 24) may be arranged in a grid between each anode 42 in the display. In this type of arrangement, leakage between all anodes will be reduced. In an alternate embodiment, shown in FIG. 26, the control gates may be arranged in columns between adjacent columns of pixels in the organic light-emitting diode display. With the control gates of FIG. 26, the leakage between adjacent pixel columns will be reduced. This type of arrangement may be suited to a display with pixels of the same color in a common column (e.g., a column of red pixels, a column of green pixels, a column of blue pixels, etc.). In this type of arrangement, leakage between adjacent red pixels may be more permissible than leakage between pixels of different colors (while still maintaining desired display performance). Therefore, reducing leakage between the columns may be sufficient for satisfactory display performance. The control gate patterns shown in FIGS. 25 and 26 are merely illustrative. In general, the control gates may be positioned in any desired manner across the display (e.g., between adjacent rows, in an irregular pattern, etc.).

Figure 27:
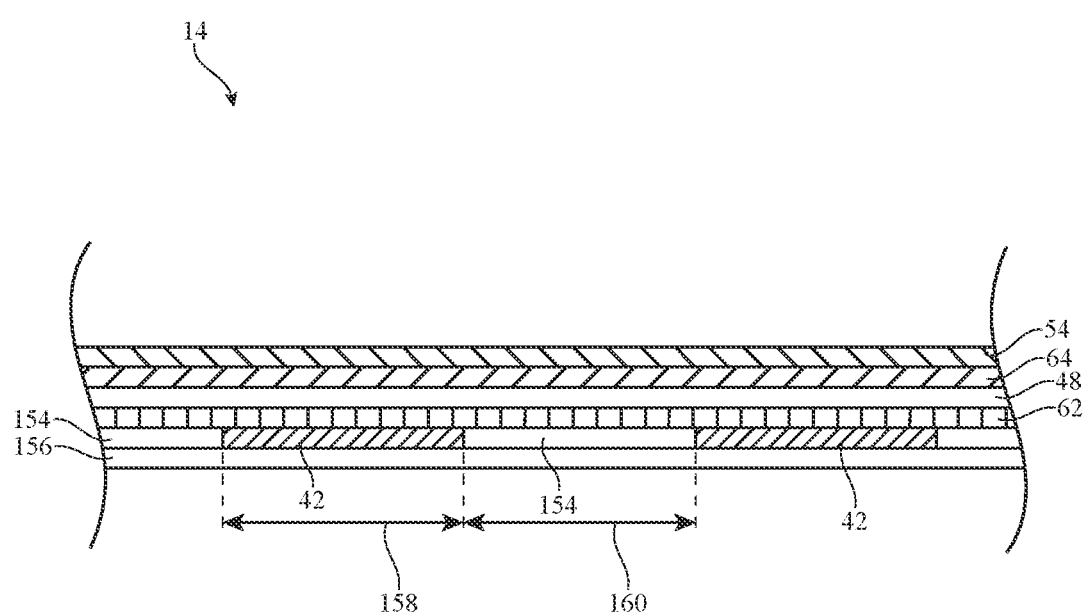
FIG. 27 is a cross-sectional side view of an illustrative organic light-emitting diode display with a reflective layer that is used to increase efficiency of the pixels in accordance with an embodiment.

In addition to lateral leakage between adjacent pixels, some organic light-emitting diode displays may have a less than desired efficiency. FIG. 27 is a cross-sectional side view of an illustrative organic light-emitting diode display with a reflective layer that is used to increase efficiency of the pixels. As shown in FIG. 27, display 14 includes anodes 42 covered by hole layer 62, emissive layer 48, electron layer 64, and cathode layer 54. Display 14 may additionally include reflective layer 156 below anodes 42. Reflective layer 156 may be formed across the entire display (such that the areas not covered by the anodes are all covered by the reflective layer). An additional dielectric layer 154 may be formed over the reflective layer and in between the anodes. Dielectric layer 154 may be a pixel definition layer if desired. Reflective layer 156 and dielectric layer 154 enable the regions between adjacent anodes to contribute to efficiency, enhancing efficiency in the display.

In FIG. 27, reflective layer 156 is formed below and in direct contact with anodes 42. Reflective layer 156 may therefore be formed from a dielectric material (e.g., to ensure the anodes are not shorted together through the reflective layer). In embodiments where reflective layer 156 is not formed in direct contact with the anodes (e.g., an intervening insulating layer is present), the reflective layer may be formed from a conductive or non-conductive material. The reflective layer may have any desired reflectance (e.g., greater than 90%, greater than 95%, greater than 80%, greater than 60%, greater than 40%, less than 95%, less than 90%, less than 80%, less than 60%, etc.).

To reduce pixel-to-pixel coupling due to lateral leakage, the size of the anodes may be reduced. Because the reflective layer increases the effective size of the pixel, the anode does not need to be as large to achieve a desired light output. Decreasing the size of the anode may reduce the pixel-to-pixel coupling due to lateral leakage between adjacent anodes without sacrificing pixel performance. In one illustrative embodiment, the width of the anodes (distance 158 in FIG. 27) may be less than the distance between adjacent anodes (distance 160 in FIG. 27). Distance 158 may be any desired distance (e.g., less than 0.1 micron, less than 1 micron, less than 10 micron, less than 50 micron, less than 100 micron, less than 1000 micron, greater than 0.1 micron, greater than 1 micron, greater than 10 micron, greater than 50 micron, greater than 100 micron, greater than 1000 micron, etc.). Similarly, distance 160 may be any desired distance (e.g., less than 0.1 micron, less than 1 micron, less than 10 micron, less than 50 micron, less than 100 micron, less than 1000 micron, greater than 0.1 micron, greater than 1 micron, greater than 10 micron, greater than 50 micron, greater than 100 micron, greater than 1000 micron, etc.).

One or more of the foregoing embodiments may be used in combination in a single organic light-emitting diode display if desired. Additionally, in the foregoing embodiments examples are presented where a common laterally conductive layer (i.e., hole layer 62) is formed on patterned anodes. However, in each embodiment the common laterally conductive layer may instead be formed on patterned cathodes. The common laterally conductive layer may be an electron layer in embodiments where the patterned electrode is a cathode. The common electrode may be an anode in embodiments where the patterned electrode is a cathode.

Additionally, several of the aforementioned embodiments describe arrangements where a discontinuity is created in a common laterally conductive layer (e.g., hole layer 62) in an organic light-emitting diode display. However, it should be understood that the example of a discontinuity being created in the common laterally conductive layer is merely illustrative. In some embodiments, the common laterally conductive layer may have a thinned portion (e.g., thinner than portions of the common laterally conductive layer directly over the anodes) that at least partially reduces conductivity of the laterally conductive layer (instead of a full discontinuity), thereby at least partially reducing lateral leakage. The thinned portion may have a thickness that is less than 80% of the thickness of the portions over the anodes, less than 60% of the thickness of the portions over the anodes, less than 40% of the thickness of the portions over the anodes, less than 20% of the thickness of the portions over the anodes, less than 100% of the thickness of the portions over the anodes, etc. In embodiments where the common laterally conductive layer has a discontinuity, the common laterally conductive layer may be considered to have a thinned portion with a thickness of zero.

In various embodiments, a display may include a substrate and an array of pixels that includes first and second pixels. The first pixel may include a first organic light-emitting diode and a first patterned electrode on the substrate and the second pixel may include a second organic light-emitting diode and a second patterned electrode on the substrate. The display may also include a common laterally conductive layer that forms part of both the first and second organic light-emitting diodes and a structure interposed between the first and second patterned electrodes. The structure may reduce an amount of leakage current that passes through the common laterally conductive layer between the first and second patterned electrodes.

The structure may include a conductive contact that is coupled to a bias voltage. The conductive contact may be formed on the substrate and the common laterally conductive layer may be formed over and in direct contact with the first and second patterned electrodes and the conductive contact. The conductive contact may be formed from the same material as the first and second patterned electrodes.

The structure may include an insulating layer with a first width and an additional layer formed over the insulating layer with a second width that is greater than the first width. The structure may be a T-shaped structure. The display may also include an emissive layer formed over the common laterally conductive layer, an additional common laterally conductive layer formed over the emissive layer, and a common electrode formed over the additional common laterally conductive layer. The common electrode has a first portion over the first patterned electrodes and a second portion over the second patterned electrodes, and the additional layer of the structure may include a conductive layer that electrically connects the first portion of the common electrode to the second portion of the common electrode.

The structure may include an insulating structure and the insulating structure may have an upper surface with a first width and a lower surface with a second width that is smaller than the first width. The common laterally conductive layer may have a first portion formed over the first patterned electrode, a second portion formed over the second patterned electrode, and a third portion formed over the insulating structure. The third portion of the common laterally conductive layer may not be electrically connected to the first and second portions of the common laterally conductive layer.

The structure may include a trench in the substrate and the common laterally conductive layer may have a first portion formed over the first patterned electrode, a second portion formed over the second patterned electrode, and a third portion formed in the trench. The display may also include an additional layer formed on the substrate. The structure may include a trench in the additional layer and the common laterally conductive layer may have a first portion formed over the first patterned electrode, a second portion formed over the second patterned electrode, and a third portion formed in the trench. The structure may include a disordered portion of the common laterally conductive layer and the disordered portion of the common laterally conductive layer may be formed over a fluorinated self-aligned monolayer. The structure may include a damaged portion of the common laterally conductive layer that has a decreased conductivity relative to portions of the common laterally conductive layer that overlap the first and second patterned electrode. The common laterally conductive layer may include a laterally conductive injection layer and a laterally conductive transport layer.

In various embodiments, a method may include forming first and second patterned electrode for first and second organic light-emitting diode display pixels on a substrate, depositing a common laterally conductive layer over the first and second patterned electrodes that forms part of both the first and second organic light-emitting diode display pixels, and with an energy source, emitting energy towards a region of the common laterally conductive layer that is interposed between the first and second patterned electrodes. The region of the common laterally conductive layer may have a reduced conductivity relative to portions of the common laterally conductive layer that are not exposed to the energy. Emitting energy towards the region of the common laterally conductive layer may include emitting energy through a masking layer and the masking layer may have an opening that overlaps the region of the common laterally conductive layer. The energy source may include one of an ultraviolet light source and a laser light source. The energy source may include one of an electron beam, a focused-ion beam, and a gas-cluster ion beam.

In various embodiments, a method of operating an organic light-emitting diode display pixel with a drive transistor, an emission transistor, and an organic light-emitting diode coupled in series between first and second power supply terminals, a node interposed between the drive transistor and the emission transistor, and a leakage current control transistor interposed between the node and a ground terminal may include asserting the emission transistor at a first time to enable the organic light-emitting diode display pixel to emit light, asserting the leakage current control transistor at the first time, deasserting the emission transistor at a second time to prevent the organic light-emitting diode display pixel from emitting light after an emission period, and deasserting the leakage current control transistor at the second time. The leakage current control transistor may have a gate that receives a bias voltage. The leakage current control transistor may always be asserted while the emission transistor is asserted and the leakage current control transistor may always be deasserted while the emission transistor is deasserted.

In various embodiments, a display includes a substrate, an array of pixels that includes a first organic light-emitting diode pixel that includes a first patterned electrode on the substrate and a second organic light-emitting diode pixel that includes a second patterned electrode on the substrate, a pixel definition layer on the substrate that is interposed between the first and second patterned electrodes, and a laterally conductive layer formed over the pixel definition layer that has a first portion that forms part of the first organic light-emitting diode pixel and a second portion that forms part of the second organic light-emitting diode pixel. The first portion may be electrically isolated from the second portion by at least one discontinuity in the laterally conductive layer created by the pixel definition layer.

The laterally conductive layer may be formed over and in direct contact with the pixel definition layer, the first patterned electrode, and the second patterned electrode. The display may also include an emissive layer formed over the laterally conductive layer and a common electrode formed over the emissive layer. The pixel definition layer may have an upper surface and a sidewall surface and the at least one discontinuity in the laterally conductive layer may be created by a recess in the sidewall surface. The pixel definition layer may have an upper surface and a sidewall surface and the at least one discontinuity in the laterally conductive layer may be created by a plurality of curves in the sidewall surface. The pixel definition layer may have an upper surface and a sidewall surface and the at least one discontinuity in the laterally conductive layer may be created by an undercut in the sidewall surface.

The pixel definition layer may include at least first and second layers of material. The pixel definition layer may include the first layer of material, the second layer of material, and a third layer of material. The first layer of material may be formed from the same material as the third layer of material and the first layer of material may be formed from a different material than the second layer of material. The first layer of material may be formed from silicon dioxide, the second layer of material may be formed from silicon nitride, the third layer of material may be formed from silicon dioxide, and the second layer of material may be interposed between the first layer of material and the third layer of material. The first layer of material may have a first thickness, the second layer of material may have a second thickness that is the same as the first thickness, and the third layer of material may have a third thickness that is the same as the first thickness. The first layer of material may have a first thickness, the second layer of material may have a second thickness, the third layer of material may have a third thickness, and the first and third thicknesses may be different. The first layer of material may be interposed between the first patterned electrode and the second layer of material, the second layer of material may be interposed between the first layer of material and the third layer of material, the first layer of material may have a first sidewall at a first angle relative to an upper surface of the first patterned electrode, the second layer of material may have a second sidewall at a second angle relative to the upper surface of the first patterned electrode, the third layer of material may have a third sidewall at a third angle relative to the upper surface of the first patterned electrode, the first angle may be less than 90 degrees, the second angle may be greater than 90 degrees, and the third angle may be less than 90 degrees.

In various embodiments, a display may include a substrate, an array of pixels that includes a first organic light-emitting diode pixel that includes a first patterned electrode on the substrate and a second organic light-emitting diode pixel that includes a second patterned electrode on the substrate, a laterally conductive layer formed over the first and second patterned electrodes that has a first portion that forms part of the first organic light-emitting diode pixel and a second portion that forms part of the second organic light-emitting diode pixel, and a control gate that is interposed between the first and second patterned electrodes and that is coupled to a bias voltage.

The control gate may form an organic thin-film transistor that shuts a current channel in the laterally conductive layer between the first patterned electrode and the second patterned electrode when coupled to the bias voltage. The display may also include gate dielectric interposed between the control gate and the laterally conductive layer. The gate dielectric may have first and second opposing sides, the first side may be in direct contact with the control gate, and the second side may be in direct contact with the laterally conductive layer.

The control gate may be formed from the same material as the first and second patterned electrodes and the control gate, the first patterned electrode, and the second patterned electrode may be coplanar. The display may also include a first contact coupled to the first patterned electrode and a second contact coupled to the second patterned electrode. The control gate may be formed from the same material as the first and second contacts and the control gate, the first contact, and the second contact may be coplanar. The display may also include a pixel definition layer interposed between the first and second patterned electrodes. The pixel definition layer may overlap the control gate. The control gate may be embedded within the pixel definition layer.

In various embodiments a display may include a substrate, a reflective layer formed on the substrate, an array of pixels that includes a first organic light-emitting diode pixel that includes a first patterned electrode on the reflective layer and a second organic light-emitting diode pixel that includes a second patterned electrode on the reflective layer, a dielectric layer formed over the reflective layer and in between the first and second patterned electrodes, and a laterally conductive layer that is formed over the dielectric layer, the first patterned electrode, and the second patterned electrode and that has a first portion that forms part of the first organic light-emitting diode pixel and a second portion that forms part of the second organic light-emitting diode pixel.

In accordance with an embodiment, a display is provided that includes a substrate, an array of pixels that includes first and second organic light-emitting diode pixels, the first organic light-emitting diode pixel includes a first patterned electrode on the substrate and the second organic light-emitting diode pixel includes a second patterned electrode on the substrate, a pixel definition layer on the substrate that is interposed between the first and second patterned electrodes, and a laterally conductive layer formed over the pixel definition layer that has a first portion that forms part of the first organic light-emitting diode pixel and a second portion that forms part of the second organic light-emitting diode pixel, the first portion is electrically isolated from the second portion by at least one discontinuity in the laterally conductive layer created by the pixel definition layer.

In accordance with another embodiment, the laterally conductive layer is formed over and in direct contact with the pixel definition layer, the first patterned electrode, and the second patterned electrode.

In accordance with another embodiment, the display includes an emissive layer formed over the laterally conductive layer, and a common electrode formed over the emissive layer.

In accordance with another embodiment, the pixel definition layer has an upper surface and a sidewall surface and the at least one discontinuity in the laterally conductive layer is created by a recess in the sidewall surface.

In accordance with another embodiment, the pixel definition layer includes at least first and second layers of material.

In accordance with another embodiment, the pixel definition layer includes the first layer of material, the second layer of material, and a third layer of material, the first layer of material is formed from the same material as the third layer of material, and the first layer of material is formed from a different material than the second layer of material.

In accordance with another embodiment, the first layer of material is formed from silicon dioxide, the second layer of material is formed from silicon nitride, and the third layer of material is formed from silicon dioxide, and the second layer of material is interposed between the first layer of material and the third layer of material.

In accordance with another embodiment, the pixel definition layer includes the first layer of material, the second layer of material, and a third layer of material, the first layer of material is interposed between the first patterned electrode and the second layer of material, the second layer of material is interposed between the first layer of material and the third layer of material, the first layer of material has a first sidewall at a first angle relative to an upper surface of the first patterned electrode, the second layer of material has a second sidewall at a second angle relative to the upper surface of the first patterned electrode, the third layer of material has a third sidewall at a third angle relative to the upper surface of the first patterned electrode, the first angle is less than 90 degrees, the second angle is greater than 90 degrees, and the third angle is less than 90 degrees.

In accordance with another embodiment, the pixel definition layer has an upper surface and a sidewall surface and the at least one discontinuity in the laterally conductive layer is created by a plurality of curves in the sidewall surface.

In accordance with an embodiment, a display is provided that includes a substrate, an array of pixels that includes first and second pixels, the first pixel includes a first organic light-emitting diode and a first patterned electrode on the substrate and the second pixel includes a second organic light-emitting diode and a second patterned electrode on the substrate, a common laterally conductive layer that forms part of both the first and second organic light-emitting diodes, and a structure interposed between the first and second patterned electrodes, the structure reduces an amount of leakage current that passes through the common laterally conductive layer between the first and second patterned electrodes.

In accordance with another embodiment, the structure includes a conductive contact that is coupled to a bias voltage.

In accordance with another embodiment, the conductive contact is formed from the same material as the first and second patterned electrodes.

In accordance with another embodiment, the structure includes an insulating structure and the insulating structure has an upper surface with a first width and a lower surface with a second width that is smaller than the first width.

In accordance with another embodiment, the common laterally conductive layer has a first portion formed over the first patterned electrode, a second portion formed over the second patterned electrode, and a third portion formed over the insulating structure and the third portion of the common laterally conductive layer is not electrically connected to the first and second portions of the common laterally conductive layer.

In accordance with another embodiment, the structure includes a trench in the substrate and the common laterally conductive layer has a first portion formed over the first patterned electrode, a second portion formed over the second patterned electrode, and a third portion formed in the trench.

In accordance with an embodiment, a display is provided that includes a substrate, an array of pixels that includes first and second organic light-emitting diode pixels, the first organic light-emitting diode pixel includes a first patterned electrode on the substrate and the second organic light-emitting diode pixel includes a second patterned electrode on the substrate, a laterally conductive layer formed over the first and second patterned electrodes that has a first portion that forms part of the first organic light-emitting diode pixel and a second portion that forms part of the second organic light-emitting diode pixel, and a control gate that is interposed between the first and second patterned electrodes and that is coupled to a bias voltage.

In accordance with another embodiment, the control gate forms an organic thin-film transistor that shuts a current channel in the laterally conductive layer between the first patterned electrode and the second patterned electrode when coupled to the bias voltage.

In accordance with another embodiment, the display includes gate dielectric interposed between the control gate and the laterally conductive layer.

In accordance with another embodiment, the control gate is formed from the same material as the first and second patterned electrodes and the control gate, the first patterned electrode, and the second patterned electrode are coplanar.

In accordance with another embodiment, the display includes a first contact coupled to the first patterned electrode, and a second contact coupled to the second patterned electrode, the control gate is formed from the same material as the first and second contacts and the control gate, the first contact, and the second contact are coplanar.

In accordance with another embodiment, the display includes a pixel definition layer interposed between the first and second patterned electrodes, the pixel definition layer overlaps the control gate.

In accordance with another embodiment, the display includes a pixel definition layer interposed between the first and second patterned electrodes, the control gate is embedded within the pixel definition layer.

The foregoing is merely illustrative and various modifications can be made by those skilled in the art without departing from the scope and spirit of the described embodiments. The foregoing embodiments may be implemented individually or in any combination.

What is claimed is:

1. A display comprising:
   a substrate;
   an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
   a pixel definition layer on the substrate that is interposed between the first and second patterned electrodes; and
   a laterally conductive layer formed over the pixel definition layer that has a first portion that forms part of the first organic light-emitting diode pixel and a second portion that forms part of the second organic light-emitting diode pixel, wherein the first portion is electrically isolated from the second portion by at least one discontinuity in the laterally conductive layer created by the pixel definition layer, wherein the pixel definition layer comprises a first layer of silicon dioxide, a second layer of silicon dioxide, and a layer of silicon nitride, wherein the layer of silicon nitride is interposed between the first and second layers of silicon dioxide, wherein the pixel definition layer has an upper surface and a sidewall surface, wherein the at least one discontinuity in the laterally conductive layer is created by a recess in the sidewall surface, wherein the first portion of the laterally conductive layer overlaps the first patterned electrode and extends towards but not past the recess in a first direction, and wherein the second portion of the laterally conductive layer overlaps the upper surface of the pixel definition layer and extends towards but not past the recess in a second direction that is opposite the first direction.

2. The display defined in claim 1, wherein the laterally conductive layer is formed over and in direct contact with the pixel definition layer, the first patterned electrode, and the second patterned electrode.

3. The display defined in claim 2, further comprising:
   an emissive layer formed over the laterally conductive layer; and
   a common electrode formed over the emissive layer.

4. A display comprising:
   a substrate;
   an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
   a pixel definition layer on the substrate that is interposed between the first and second patterned electrodes; and
   a laterally conductive layer formed over the pixel definition layer that has a first portion that forms part of the first organic light-emitting diode pixel and a second portion that forms part of the second organic light-emitting diode pixel, wherein the first portion is electrically isolated from the second portion by at least one discontinuity in the laterally conductive layer created by the pixel definition layer, wherein the pixel definition layer comprises a first layer of material, a second layer of material, and a third layer of material, wherein the first layer of material is interposed between the first patterned electrode and the second layer of material, wherein the second layer of material is interposed between the first layer of material and the third layer of material, wherein the first layer of material has a first sidewall at a first angle relative to an upper surface of the first patterned electrode, wherein the second layer of material has a second sidewall at a second angle relative to the upper surface of the first patterned electrode, wherein the third layer of material has a third sidewall at a third angle relative to the upper surface of the first patterned electrode, wherein the first angle is less than 90 degrees, wherein the second angle is greater than 90 degrees, and wherein the third angle is less than 90 degrees.

5. A display comprising:
   a substrate;
   an array of pixels that includes first and second pixels, wherein the first pixel includes a first organic light-emitting diode and a first patterned electrode on the substrate and wherein the second pixel includes a second organic light-emitting diode and a second patterned electrode on the substrate;

a common laterally conductive layer that forms part of both the first and second organic light-emitting diodes; and a structure interposed between the first and second patterned electrodes, wherein the structure reduces an amount of leakage current that passes through the common laterally conductive layer between the first and second patterned electrodes, wherein the structure comprises a conductive contact that is coupled to a bias voltage, wherein the conductive contact is part of a grid with a plurality of openings, and wherein each pixel in the array of pixels is formed in a respective opening of the plurality of openings.

6. The display defined in claim 5, wherein the conductive contact is formed from the same material as the first and second patterned electrodes.

7. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
a laterally conductive layer formed over the first and second patterned electrodes that has a first portion that forms part of the first organic light-emitting diode pixel and a second portion that forms part of the second organic light-emitting diode pixel; and
a control gate that is interposed between the first and second patterned electrodes and that is coupled to a bias voltage, wherein the control gate is formed from the same material as the first and second patterned electrodes and wherein the control gate, the first patterned electrode, and the second patterned electrode are coplanar.

8. The display defined in claim 7, wherein the control gate forms an organic thin-film transistor that shuts a current channel in the laterally conductive layer between the first patterned electrode and the second patterned electrode when coupled to the bias voltage.

9. The display defined in claim 7, further comprising:
gate dielectric interposed between the control gate and the laterally conductive layer.

10. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
a laterally conductive layer formed over the first and second patterned electrodes that has a first portion that forms part of the first organic light-emitting diode pixel and a second portion that forms part of the second organic light-emitting diode pixel;
a control gate that is interposed between the first and second patterned electrodes and that is coupled to a bias voltage;
a first contact coupled to the first patterned electrode; and
a second contact coupled to the second patterned electrode, wherein the control gate is formed from the same material as the first and second contacts and wherein the control gate, the first contact, and the second contact are coplanar.

11. The display defined in claim 7, further comprising:
a pixel definition layer interposed between the first and second patterned electrodes, wherein the pixel definition layer overlaps the control gate.

12. A display comprising:
a substrate;
an array of pixels that includes first and second organic light-emitting diode pixels, wherein the first organic light-emitting diode pixel includes a first patterned electrode on the substrate and wherein the second organic light-emitting diode pixel includes a second patterned electrode on the substrate;
a laterally conductive layer formed over the first and second patterned electrodes that has a first portion that forms part of the first organic light-emitting diode pixel and a second portion that forms part of the second organic light-emitting diode pixel;
a control gate that is interposed between the first and second patterned electrodes and that is coupled to a bias voltage; and
a pixel definition layer interposed between the first and second patterned electrodes, wherein the control gate is embedded within the pixel definition layer.

* * * * *